(12) United States Patent
Bussiere et al.

(10) Patent No.: US 11,535,460 B2
(45) Date of Patent: Dec. 27, 2022

(54) SUBSTRATE PROCESSING APPARATUS

(71) Applicant: Brooks Automation, Inc., Chelmsford, MA (US)

(72) Inventors: Christopher A. Bussiere, Groton, MA (US); Robert T. Caveney, Windham, NH (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

(21) Appl. No.: 16/426,983

(22) Filed: May 30, 2019

(65) Prior Publication Data

US 2020/0002104 A1  Jan. 2, 2020

Related U.S. Application Data

(60) Provisional application No. 62/678,963, filed on May 31, 2018.

(51) Int. Cl.

| B65G 47/90 | (2006.01) |
|---|---|
| B25J 9/04 | (2006.01) |
| H01L 21/677 | (2006.01) |
| H01L 21/687 | (2006.01) |

(52) U.S. Cl.
CPC .............. *B65G 47/90* (2013.01); *B25J 9/042* (2013.01); *H01L 21/67742* (2013.01); *H01L 21/68707* (2013.01)

(58) Field of Classification Search
None
See application file for complete search history.

(56) References Cited

U.S. PATENT DOCUMENTS

| 5,064,340 | A  * | 11/1991 | Genov | ..................... B25J 9/104 |
|---|---|---|---|---|
|  |  |  |  | 414/744.5 |
| 6,293,746 | B1 * | 9/2001 | Ogawa | ..................... B25J 9/042 |
|  |  |  |  | 414/744.4 |
| 9,076,829 | B2 | 7/2015 | Brodine et al. | |
| 11,192,239 | B2 | 12/2021 | Tsang et al. | |
| 2008/0298945 | A1 | 4/2008 | Cox et al. | |
| 2012/0141235 | A1 | 6/2012 | Krupyshev et al. | |
| 2012/0189419 | A1 | 7/2012 | Yazawa et al. | |
| 2012/0232690 | A1 * | 9/2012 | Gilchrist | .................. B25J 9/043 |
|  |  |  |  | 700/228 |

(Continued)

OTHER PUBLICATIONS

International Search Report,International Application No. PCT/US2019/054780, dated Oct. 4, 2019.

*Primary Examiner* — Ronald P Jarrett
(74) *Attorney, Agent, or Firm* — Perman & Green, LLP; Colin C. Durham

(57) ABSTRACT

A substrate processing apparatus includes a frame and a transport apparatus connected to the frame. The transport apparatus has an upper arm link, a forearm link rotatably coupled to the upper arm link about an elbow axis, at least a third arm link rotatably coupled to the forearm about a wrist axis, and an end effector rotatably coupled to the third arm link about a knuckle axis. A two degree of freedom drive system is operably connected to at least one of the upper arm link, the forearm link, and the third arm link for effecting extension and retraction of the end effector wherein a height of the end effector is within the stack height profile of the wrist axis so that a total stack height of the end effector and wrist axis is sized to conform within a pass through of a slot valve.

27 Claims, 29 Drawing Sheets

(56) References Cited

U.S. PATENT DOCUMENTS

2014/0199138 A1* 7/2014 van der Meulen .......................... H01L 21/67742
                                                                      414/217
2015/0128749 A1   5/2015 Gilchrist
2018/0019155 A1   1/2018 Tsang et al.

* cited by examiner

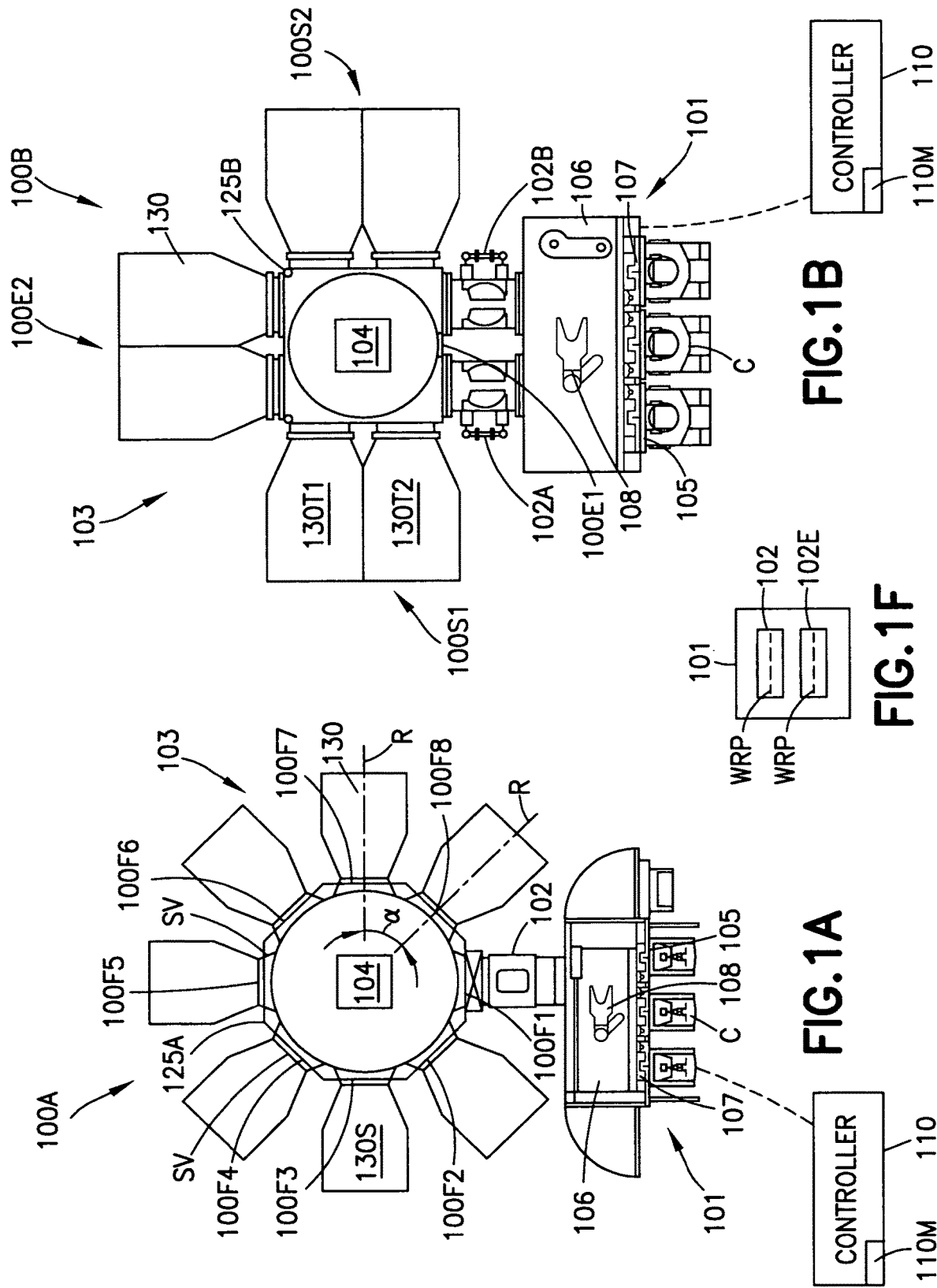

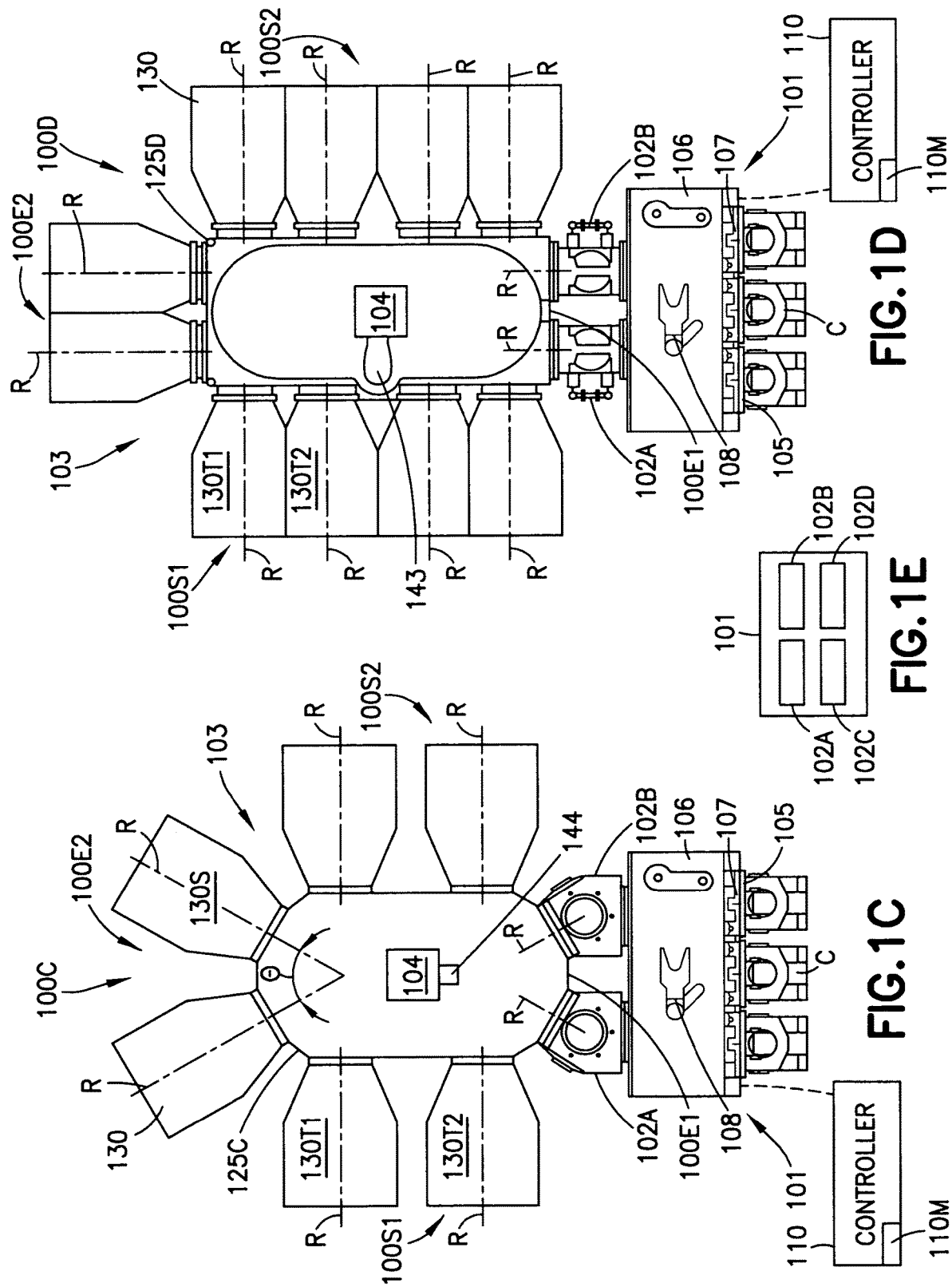

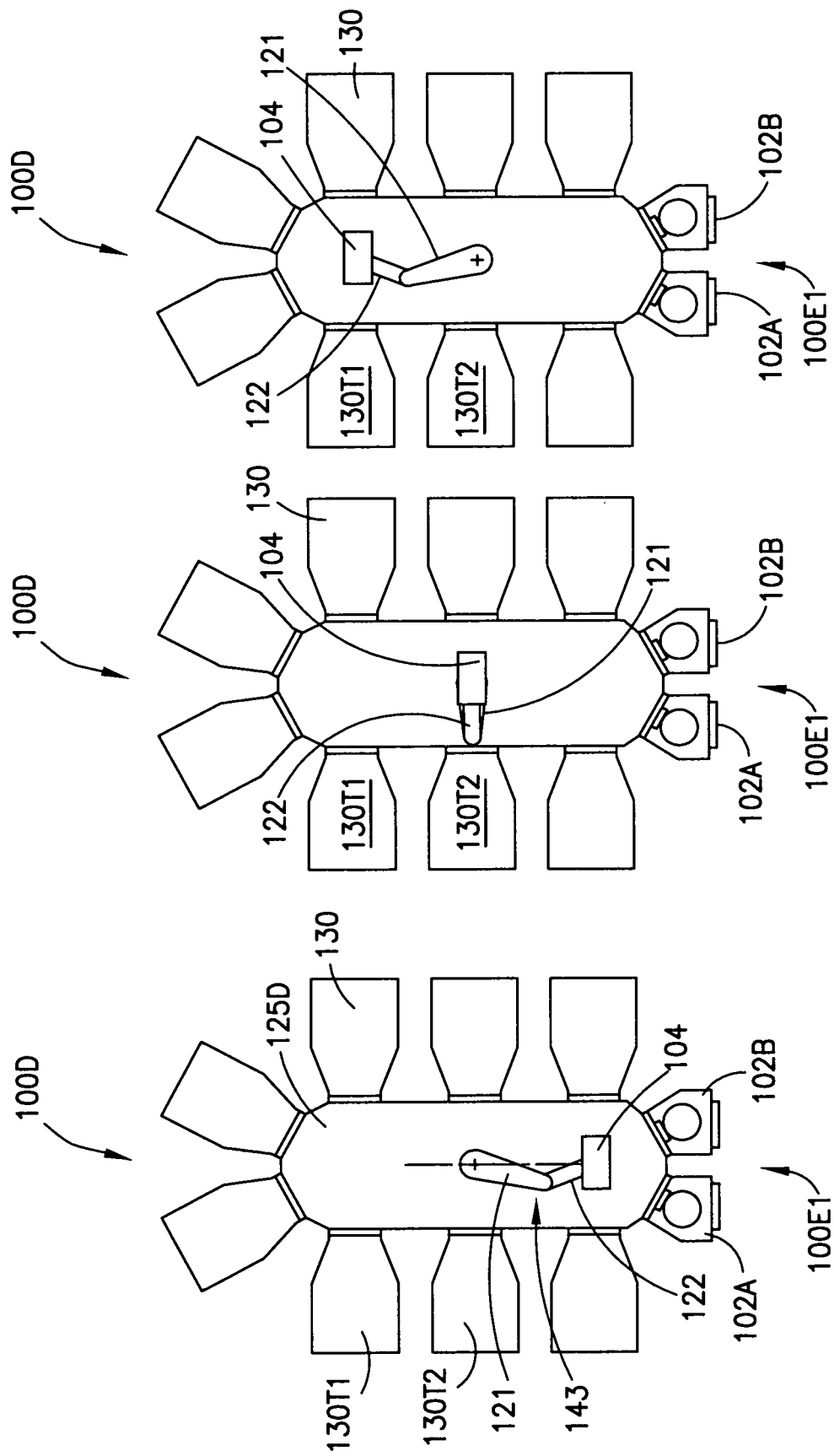

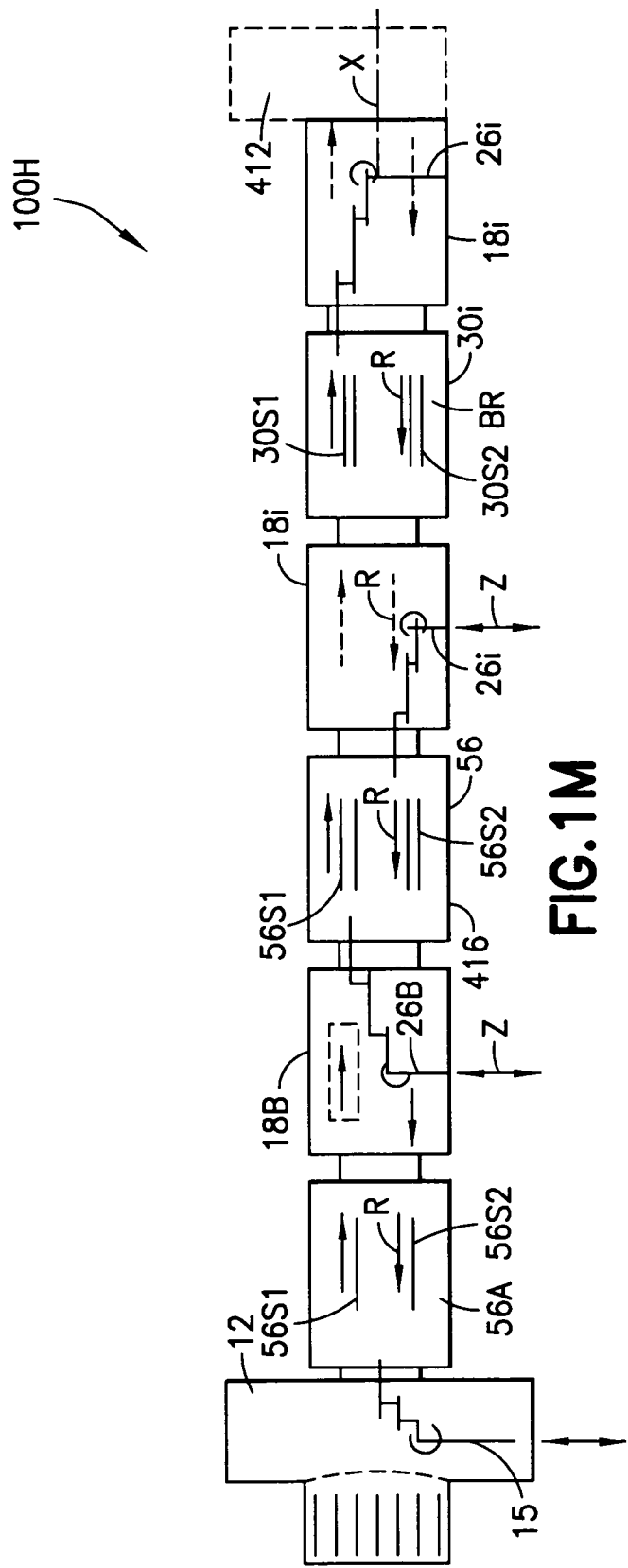

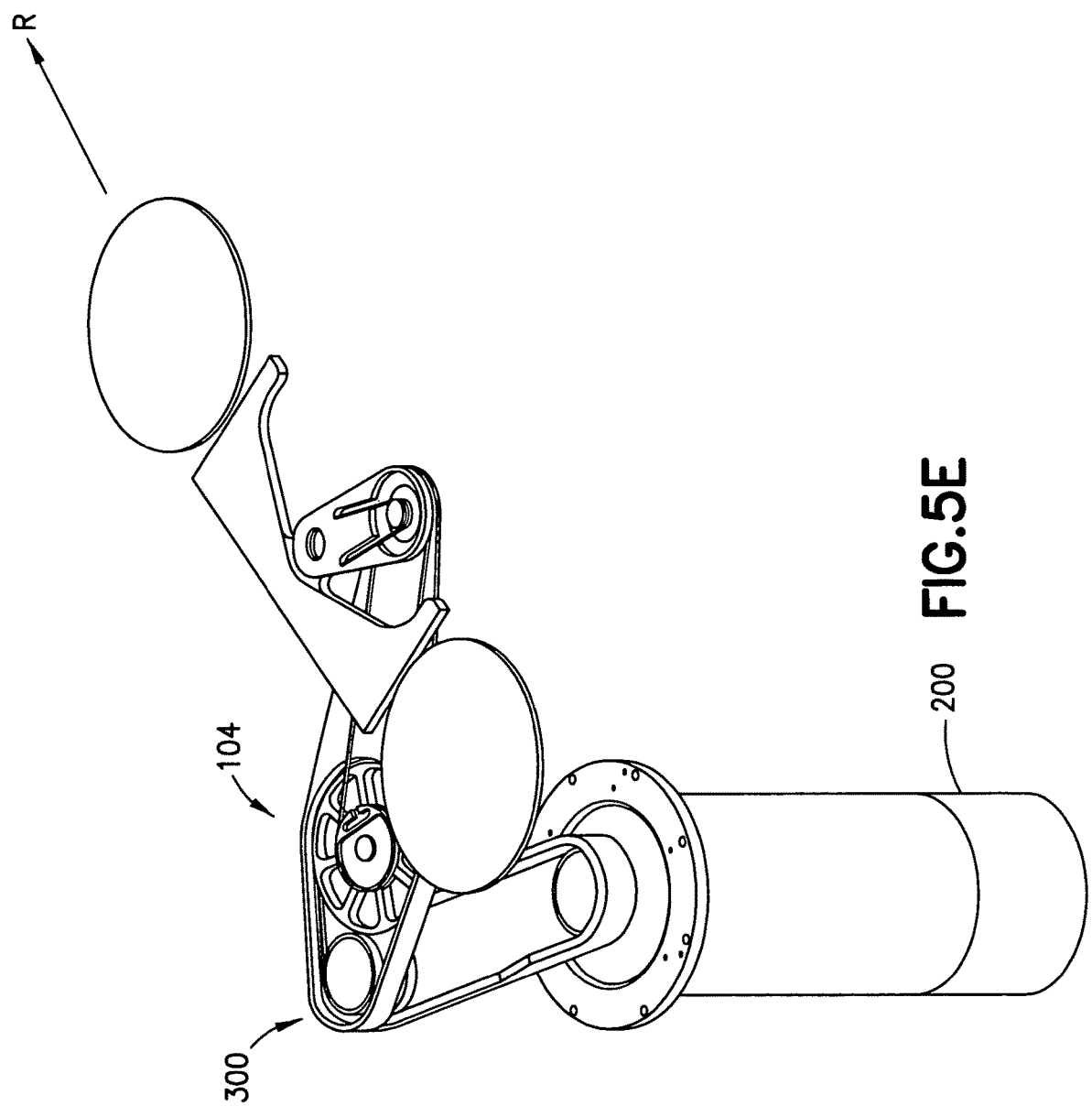

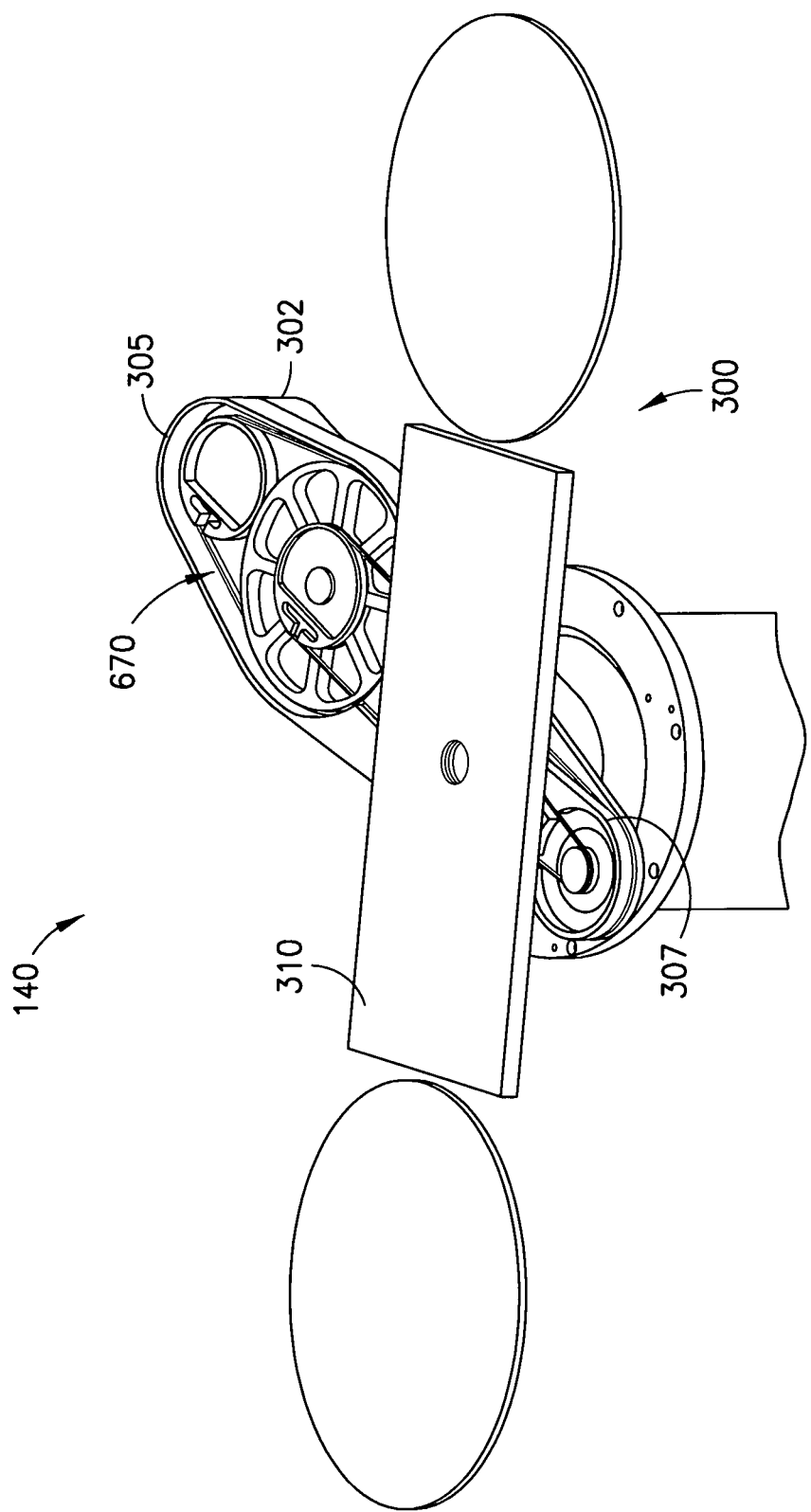

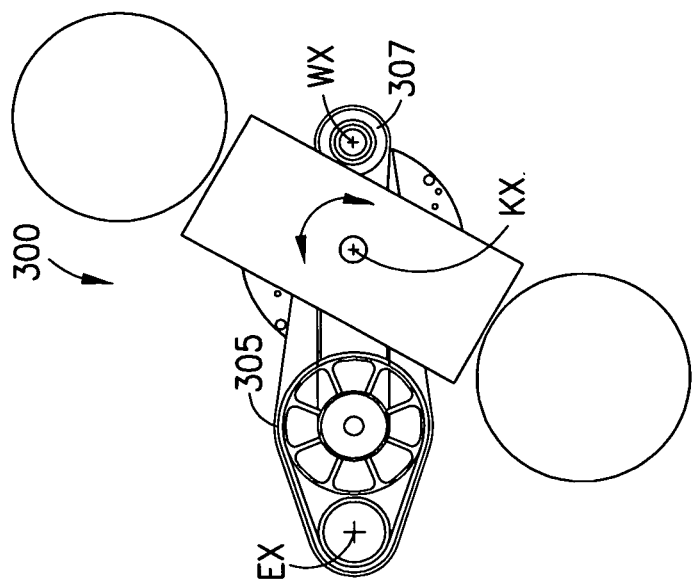
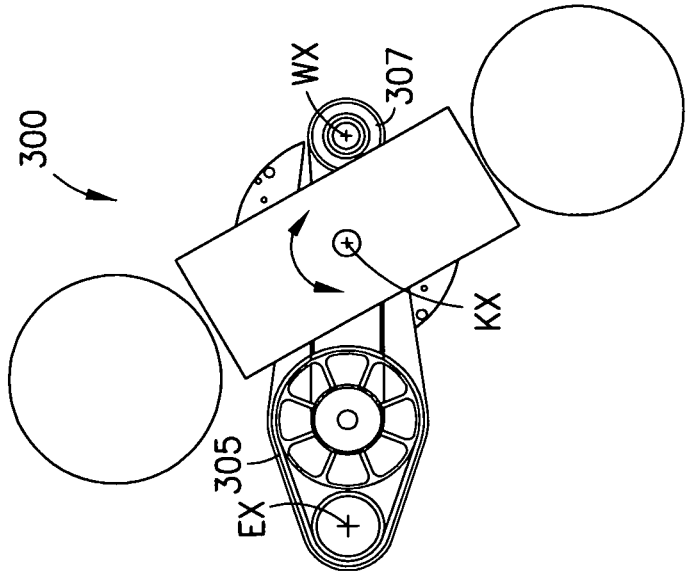
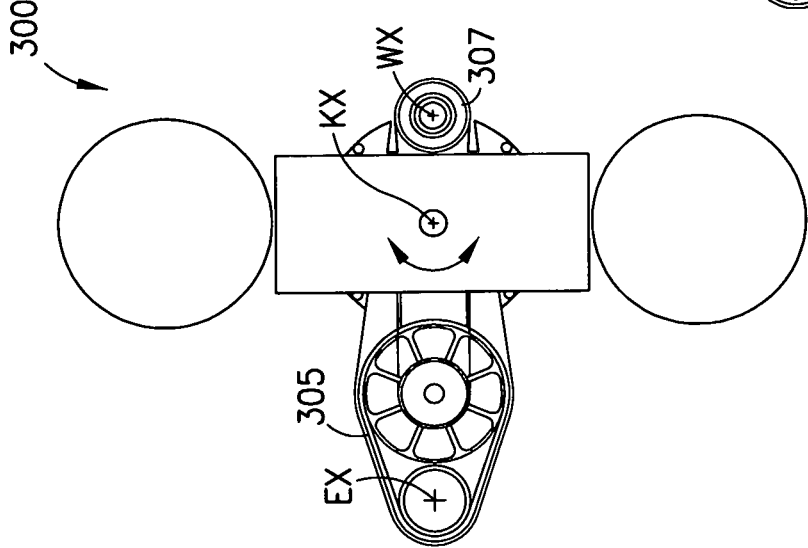
FIG. 6C
FIG. 6D
FIG. 6E

SUBSTRATE PROCESSING APPARATUS

CROSS REFERENCE TO RELATED APPLICATIONS

This application is a non-provisional of and claims the benefit of U.S. provisional patent application No. 62/678,963 filed on May 31, 2018, the disclosure of which is incorporated herein by reference in its entirety.

BACKGROUND

1. Field

The exemplary embodiments generally relate to automated processing equipment, and more particularly, to substrate transport apparatus.

2. Brief Description of Related Developments

Generally, a distance a substrate transport apparatus is allowed to extend through a transport chamber gate valve into a processing module is limited by the size of the gate valve. Generally, only the end effector extends through the gate valve while the remainder of the substrate transport apparatus arm remains within the transport chamber.

It would be advantageous to transport a substrate through a transport chamber gate valve so that at least a portion of the arm link(s) supporting the end effector extend through the gate valve to provide for a greater reach into a processing module coupled to the transport chamber gate valve.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of substrate processing apparatus in accordance with aspects of the disclosed embodiment;

FIGS. 1E and 1F are schematic illustrations of portions of the substrate processing apparatus of FIGS. 1A-1D in accordance with aspects of the disclosed embodiment;

FIGS. 1G-1M are schematic illustrations of substrate processing apparatus in accordance with aspects of the disclosed embodiment;

FIGS. 5A-5F are exemplary illustrations of an extension/retraction sequence of a substrate transport apparatus in accordance with aspects of the disclosed embodiment;

FIGS. 6A-6E are schematic illustrations of a substrate transport apparatus in accordance with aspects of the disclosed embodiment;

DETAILED DESCRIPTION

FIGS. 1A-1M are schematic illustrations of substrate processing apparatus in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

The aspects of the disclosed embodiment provide for methods and apparatus that effect transfer of substrates with a transport arm to and from a deep set substrate holding station of a processing module where, at least a third arm link (also referred to as a truncated arm link), of the transport arm, that has a knuckle axis of rotation provides the transport arm with a longer reach than a conventional transport arm having equal or unequal arm links as will be described in further detail below. The truncated arm link is coupled to a forearm of the transport arm at a wrist axis (also referred to as a wrist joint) and is sized, with the forearm and end effector coupled to the truncated arm link, so as to have a stack height that allows the wrist axis to pass through a gate valve pass through or port of the processing module. The wrist passing through the gate valve port provides for a portion of the forearm, the wrist axis, the truncated arm link and at least a portion of the end effector to extend within the processing chamber for accessing the deep set substrate holding station of the processing module.

Figure 1J:
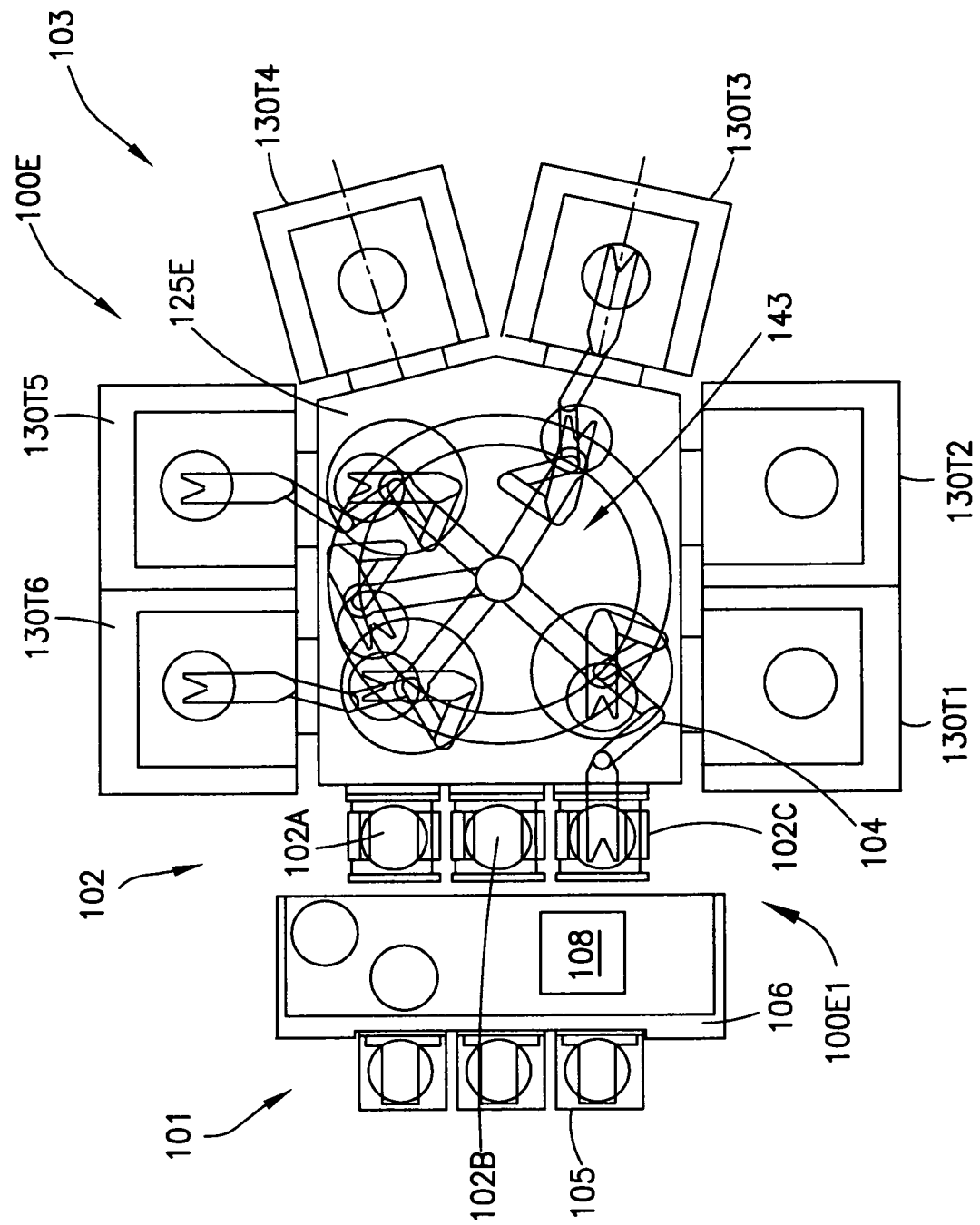
Figure 1K:
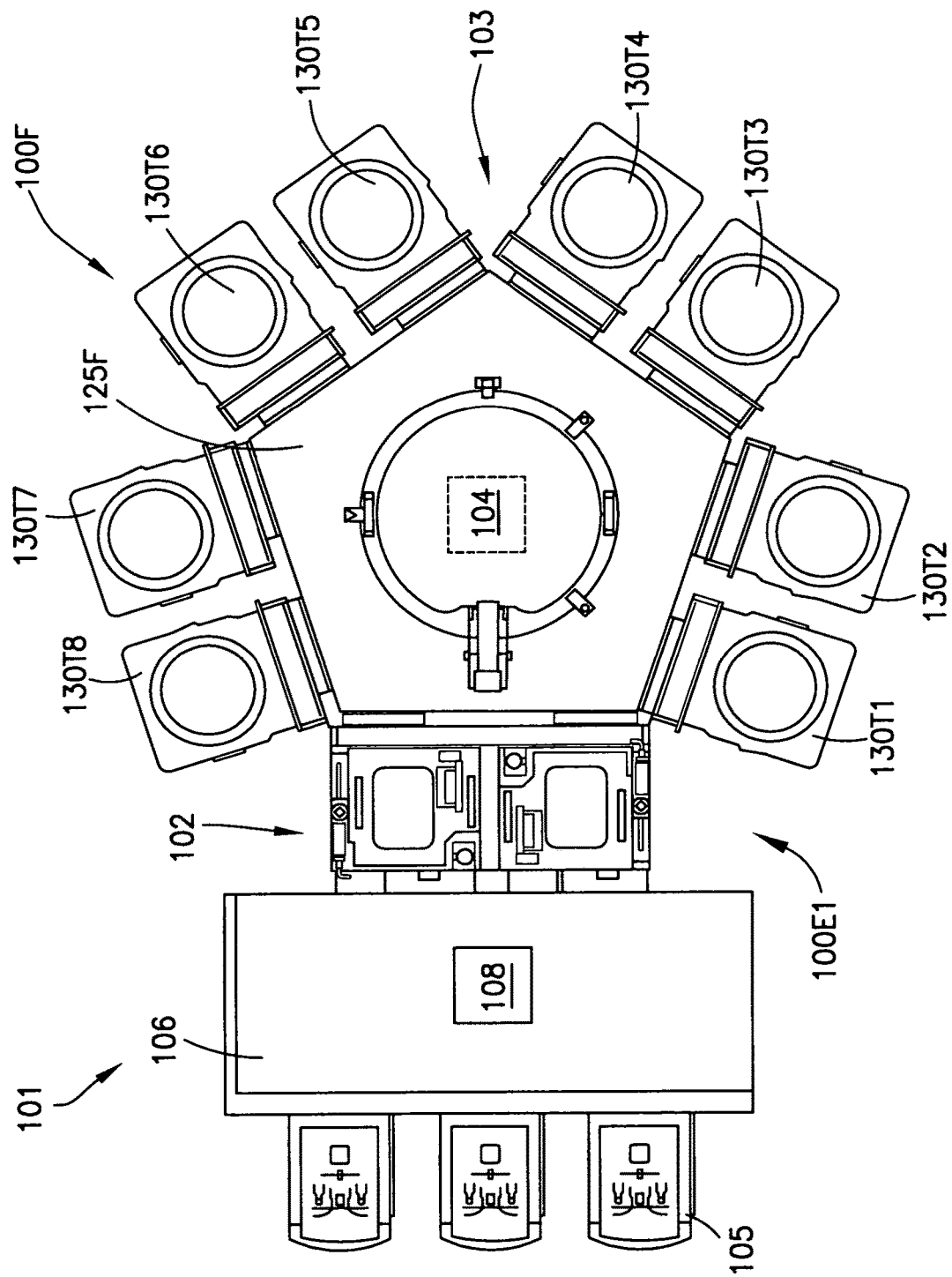

The processing apparatus 100A, 100B, 100C, 100D, 100E, 100F, 100G, 100H such as for example a semiconductor tool station, is shown in accordance with aspects of the disclosed embodiment. Although a semiconductor tool station is shown in the drawings, the aspects of the disclosed embodiment described herein can be applied to any tool station or application employing torque couplings. In one aspect the processing apparatus 100A, 100B, 100C, 100D, 100E, 100F, 100G, 100H, 100I are shown as having cluster tool arrangements (e.g., having substrate holding stations connected to a central chamber) while in other aspects the processing apparatus may be a linearly arranged tool 100L, 100M, as described in U.S. Pat. No. 8,398,355, entitled "Linearly Distributed Semiconductor Workpiece Processing Tool," issued Mar. 19, 2013 (the disclosure of which is incorporated herein by reference in its entirety); however the aspects of the disclosed embodiment may be applied to any suitable tool station. The apparatus 100A, 100B, 100C, 100D, 100E, 100F, 100G, 100H, 100I generally include an atmospheric front end 101, at least one vacuum load lock 102, 102A, 102B, 102C and a vacuum back end 103. The at least one vacuum load lock 102, 102A, 102B, 102C may be coupled to any suitable port(s) or opening(s) of the front end 101 and/or back end 103 in any suitable arrangement. For example, in one aspect the one or more load locks 102, 102A, 102B, 102C may be arranged in a common horizontal plane in a side by side arrangement as can be seen in FIGS. 1B-1D and 1G-1K. In other aspects the one or more load locks may be arranged in a grid format such that at least two load locks 102A, 102B, 102C, 102D are arranged in rows (e.g., having spaced apart horizontal planes) and columns (e.g., having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D, 125E, 125F in other aspects the one or more load lock may be arranged on any number of sides 100S1, 100S2, ends 100E1, 100E2 or facets 100F1-100F8 of the transport chamber 125A, 125B, 125C, 125D, 125E, 125F. Each of the at least one load lock may also include one or more wafer/substrate resting planes WRP (FIG. 1F) in which substrates are held on suitable supports within the respective load lock. In other aspects, the tool station may have any suitable configuration.

The components of each of the front end 101, the at least one load lock 102, 102A, 102B, 102C and back end 103 may be connected to a controller 110 which may be part of any suitable control architecture such as, for example, a clustered architecture control. The control system may be a closed loop controller having a master controller (which in one aspect may be controller 110), cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, 1J and 1K, in other aspects any suitable number of load port modules may be incorporated into the front end 101.

The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B, 102C may be located between and connected to the mini-environment 106 and the back end 103. In other aspects the load ports 105 may be coupled substantially directly to the at least one load lock 102, 102A, 102B, 102C or the transport chamber 125A, 125B, 125C, 125D, 125E, 125F where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transport apparatus may be provided within the load lock or otherwise have access to the carrier C for transferring substrates to and from the substrate carrier C. It is noted that the term vacuum as used herein may denote a high vacuum such as $10^{-5}$ Torr or below in which the substrates are processed.

The at least one load lock 102, 102A, 102B, 102C generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D, 100E, 100F (as well as linear processing apparatus 100G, 100H) may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B, 102C coupled to the transport chamber 125A, 125B, 125C, 125D, 125E, 125F. The at least one load lock 102, 102A, 102B, 102C (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, 125E, 125F one or more processing station(s) or module(s) 130 and any suitable number of substrate transport apparatus 104 that includes one or more transport robots which may include one or more aspects of the disclosed embodiments described herein. The transport chamber 125A, 125B, 125C, 125D, 125E, 125F may have any suitable shape and size that, for example, complies with SEMI standard E72 guidelines. The substrate transport apparatus 104 and the one or more transport robot will be described below and may be located at least partly within the transport chamber 125A, 125B, 125C, 125D, 125E, 125F to transport substrates between the load lock 102, 102A, 102B, 120C (or between a cassette C located at a load port) and the various processing stations 130. In one aspect the substrate transport apparatus 104 may be removable from the transport chamber 125A, 125B, 125C, 125D, 125E, 125F as modular unit such that the substrate transport apparatus 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125A, 125B, 125C, 125D, 125E, 125F in any suitable manner, such as through slot valves SV, to allow substrates to be passed from the transport chamber 125A, 125B, 125C, 125D, 125E, 125F to the processing stations 130 and vice versa. The slot valves SV of the transport chamber 125A, 125B, 125C, 125D, 125E, 125F may be arranged to allow for the connection of twin (e.g., more than one substrate processing chamber located within a common housing) or side-by-side process stations 130T1-130T8, single process stations 130S and/or stacked process modules/load locks (FIGS. 1E and 1F). As further described below, the substrate transport apparatus effects the repeatability and accuracy throughout the range and variance of temperatures and pressures/vacuum that the substrate transport apparatus is subjected to corresponding to processes within the respective processing apparatus.

It is noted that the transfer of substrates to and from the processing station 130 and load locks 102, 102A, 102B, 102C (or cassette C) coupled to the transfer chamber 125A, 125B, 125C, 125D, 125E, 125F may occur when one or more arms of the substrate transport apparatus 104 are aligned with a predetermined processing station 130 along an axis of extension and retraction R of the substrate transport apparatus 104. In accordance with aspects of the disclosed embodiment one or more substrates may be transferred to a respective predetermined processing station 130 individually or substantially simultaneously (e.g., such as when substrates are picked/placed from side-by-side or tandem processing stations as shown in FIGS. 1B, 1C, 1D and 1G-1K. In one aspect the substrate transport apparatus 104 may be mounted on a boom arm 143 (see e.g., FIGS. 1D and 1G-1I), where the boom arm 143 has a single boom link or multiple boom links 121, 122, or linear carriage 144 such as that described in U.S. provisional patent application Nos. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 1L:
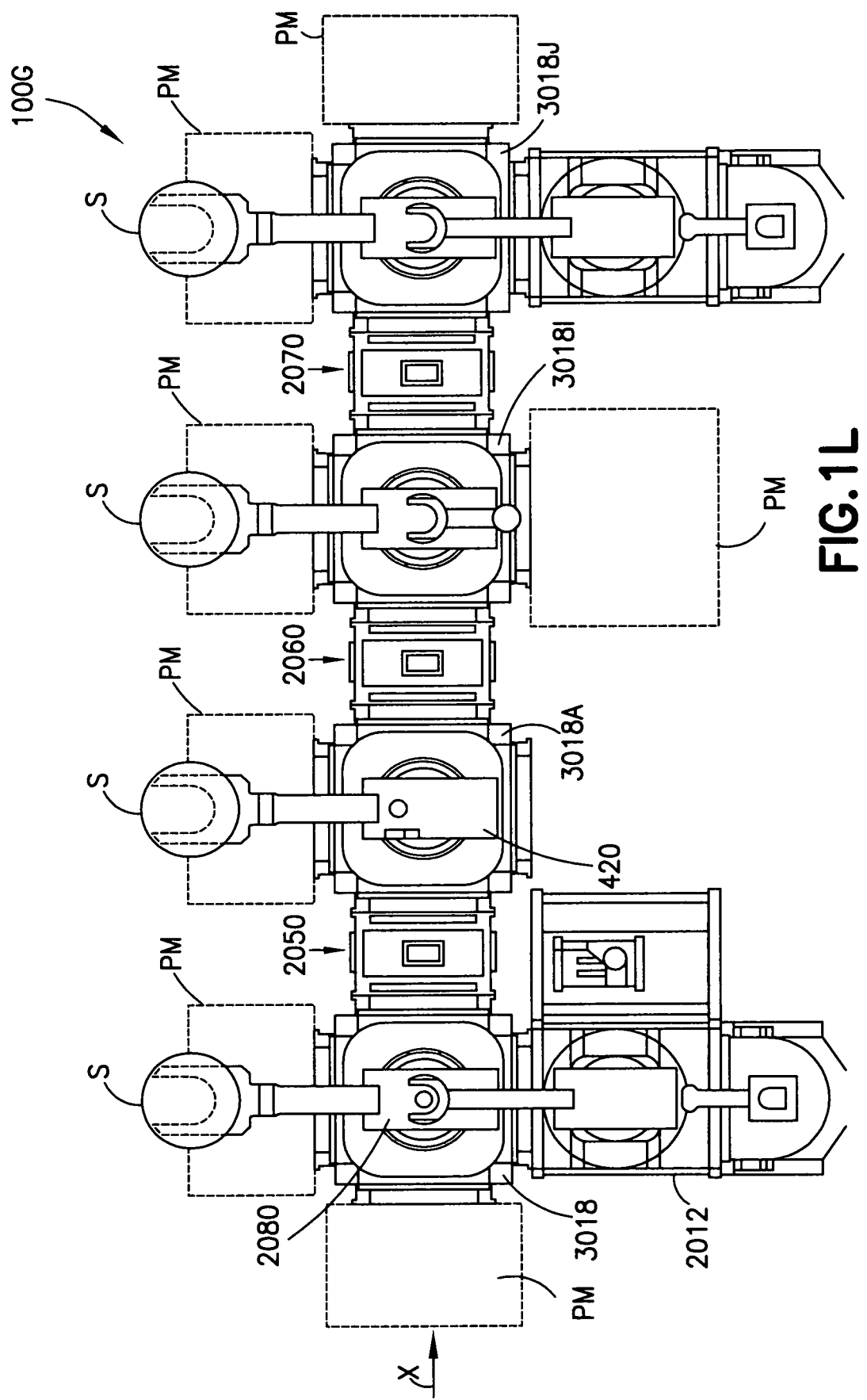

Referring now to FIG. 1L, a schematic plan view of a linear wafer processing system 100G is shown where the tool interface section 2012 is mounted to a transport chamber module 3018 so that the tool interface section 2012 is facing generally towards (e.g., inwards) but is offset from the longitudinal axis X of the transport chamber module 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3018A, 3018I, 3018J includes any suitable wafer transport 2080, which may include one or more aspects of the disclosed embodiment described herein, for transporting wafers throughout the processing system 100G and into and out of, for example, processing modules PM. As may be realized, each chamber module may be capable of holding an isolated or controlled atmosphere (e.g., N2, clean air, vacuum).

Referring to FIG. 1M, there is shown a schematic elevation view of an exemplary processing tool 100H such as may be taken along longitudinal axis X of the linear transport chamber 416. In the aspect of the disclosed embodiment shown in FIG. 1M, tool interface section 12 may be representatively connected to the linear transport chamber 416. In this aspect, interface section 12 may define one end of the linear transport chamber 416. As seen in FIG. 1M, the linear transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the linear transport chamber 416 may have one or more transfer chamber module(s) 18B, 18i. Each chamber module may be capable of holding an isolated or controlled atmosphere (e.g., N2, clean air, vacuum). As noted before, the configuration/arrangement of the transport chamber modules 18B, 18i, load lock modules 56A, and workpiece stations forming the linear transport chamber 416 shown in FIG. 1M is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

As also noted before, transport chamber modules 18B, 18i have one or more corresponding substrate transport apparatus 26B, 26i, which may include one or more aspects of the disclosed embodiment described herein, located therein. The substrate transport apparatus 26B, 26i of the respective transport chamber modules 18B, 18i may cooperate to provide the linearly distributed workpiece transport system 420 in the transport chamber. In this aspect, the substrate transport apparatus 26B may have a general SCARA arm configuration (though in other aspects the transport arms may have any other desired arrangement as described below).

In the aspect of the disclosed embodiment shown in FIG. 1M, the arms and/or end effectors of the transport apparatus 26B may be arranged to provide what may be referred to as fast swap arrangement allowing the transport to quickly swap wafers from a pick/place location. The substrate transport apparatus 26B may have any suitable drive section (e.g., coaxially arranged drive shafts, side by side drive shafts, horizontally adjacent motors, vertically stacked motors, etc.), for providing each arm with any suitable number of degrees of freedom (e.g., independent rotation about shoulder and elbow joints with Z axis motion). As seen in FIG. 1M, in this aspect the modules 56A, 56, 30i may be located interstitially between transfer chamber modules 18B, 18i and define suitable processing modules, load lock(s), buffer station(s), metrology station(s) or any other desired station(s). For example the interstitial modules, such as load locks 56A, 56 and workpiece station 30i, each have stationary workpiece supports/shelves 56S1, 56S2, 30S1, 30S2 that cooperate with the substrate transport apparatus to effect transport or workpieces through the length of the transport chamber along linear axis X of the transport chamber. By way of example, workpiece(s) may be loaded into the linear transport chamber 416 by interface section 12. The workpiece(s) may be positioned on the support(s) of load lock module 56A with the substrate transport apparatus 15 of the interface section. The workpiece(s), in load lock module 56A, may be moved between load lock module 56A and load lock module 56 by the substrate transport apparatus 26B in module 18B, and in a similar and consecutive manner between load lock 56 and workpiece station 30*i* with substrate transport apparatus 26*i* (in module 18*i*) and between station 30*i* and station 412 with substrate transport apparatus 26*i* in module 18*i*. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18*i*. In such aspects, substrate transport apparatus of adjoining transport chamber modules may pass off workpieces directly from one end effector or one transport arm to an end effector or transport arm of another substrate transport apparatus to move the workpiece through the transport chamber. The processing station modules may operate on the wafers through various deposition, etching, or other types of processes to form electrical circuitry or other desired structure on the wafers. The processing station modules are connected to the transport chamber modules to allow wafers to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Figure 2A:
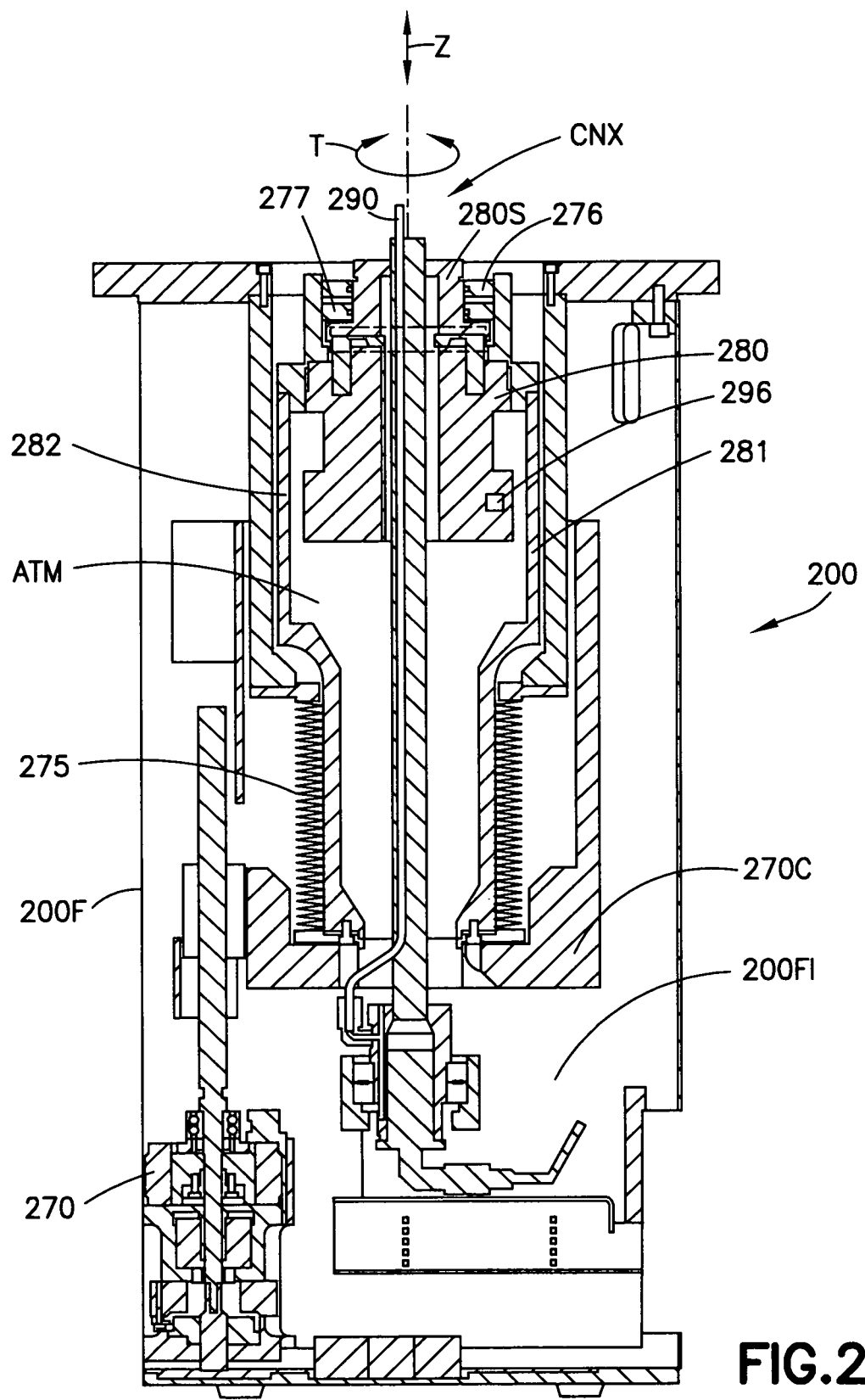
FIGS. 2A-2D are schematic illustrations of portions of substrate transport drive sections in accordance with aspects of the disclosed embodiment.
Figure 2B:
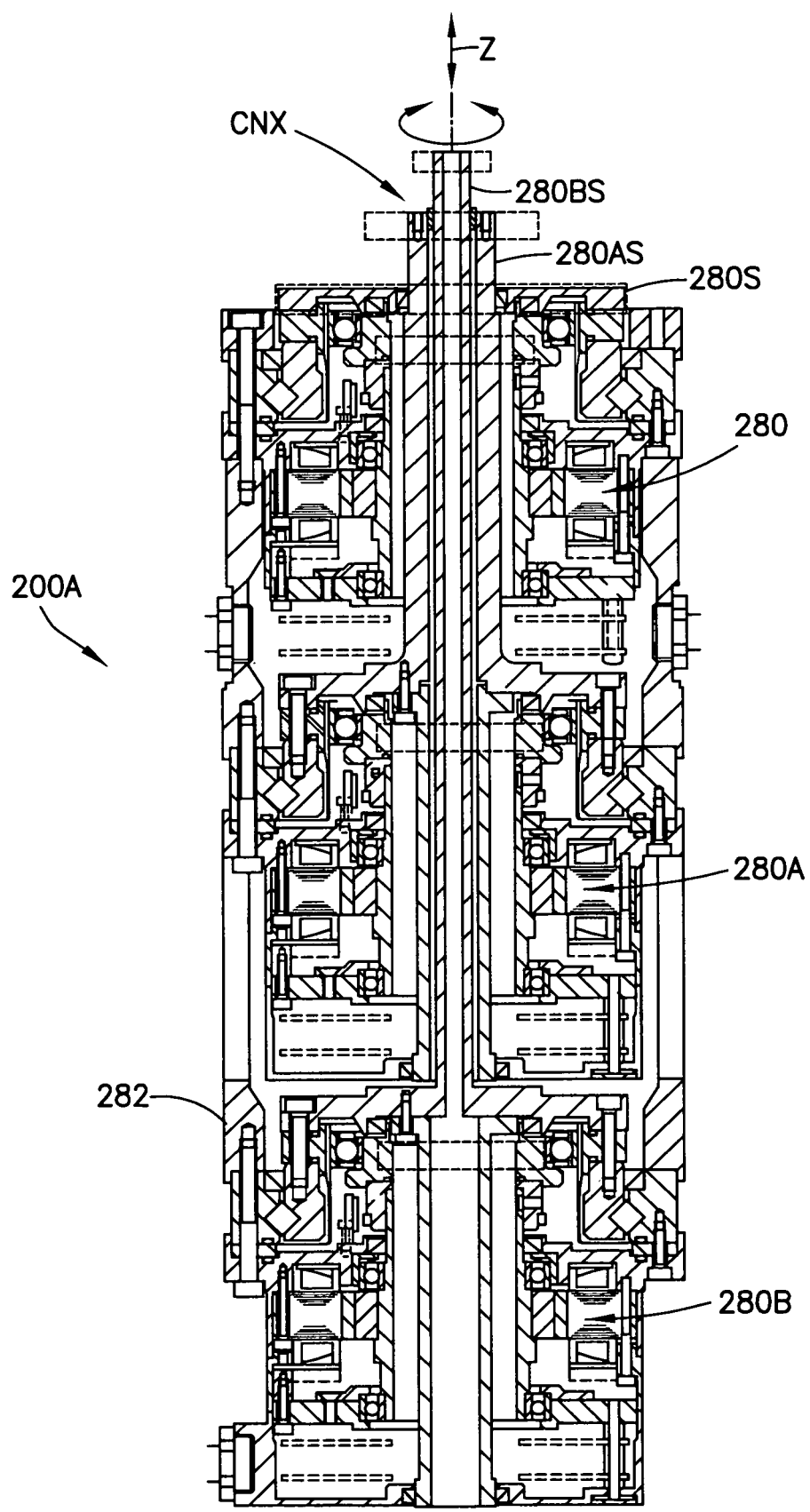
Figure 2C:
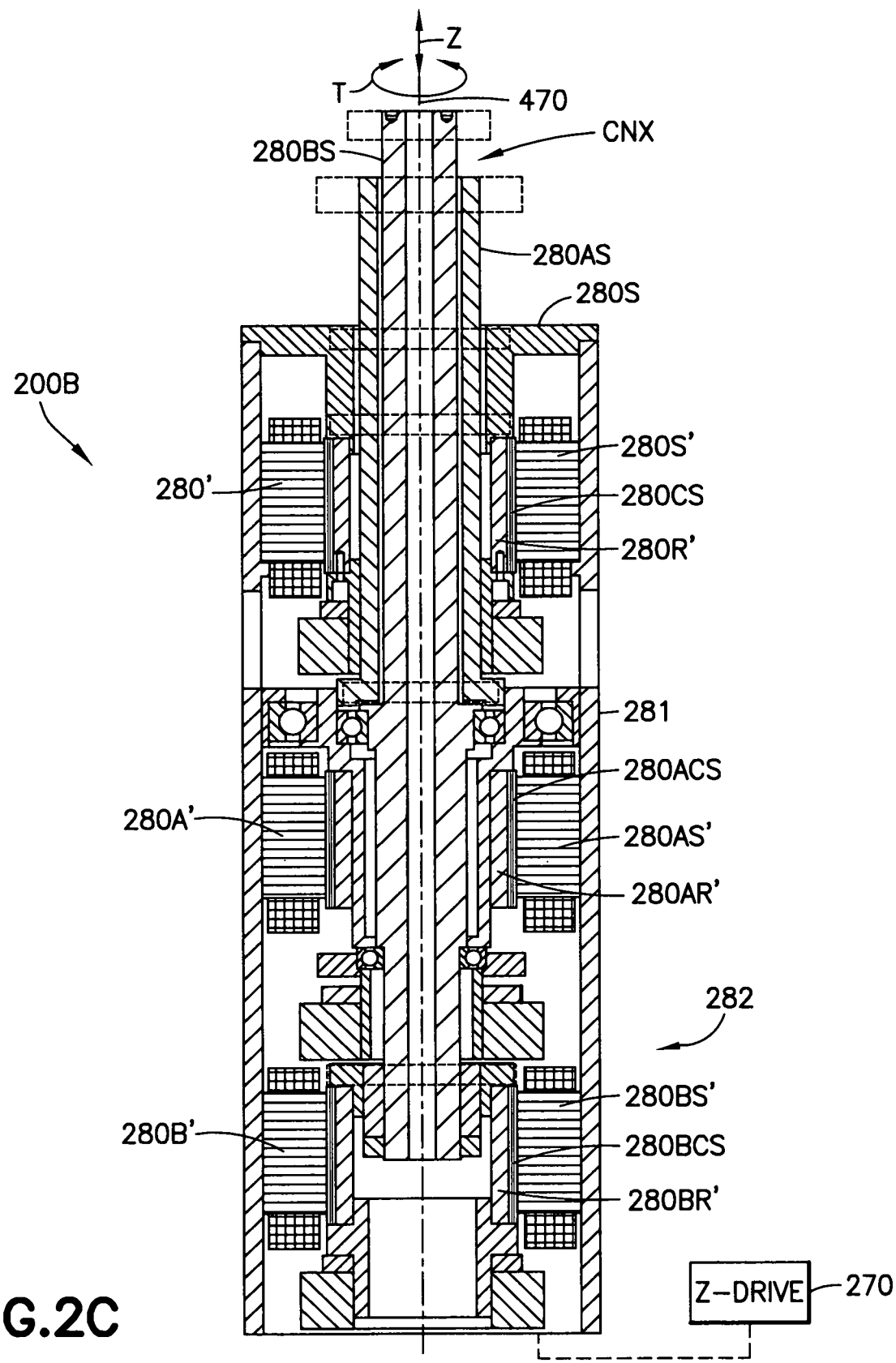
Figure 2D:
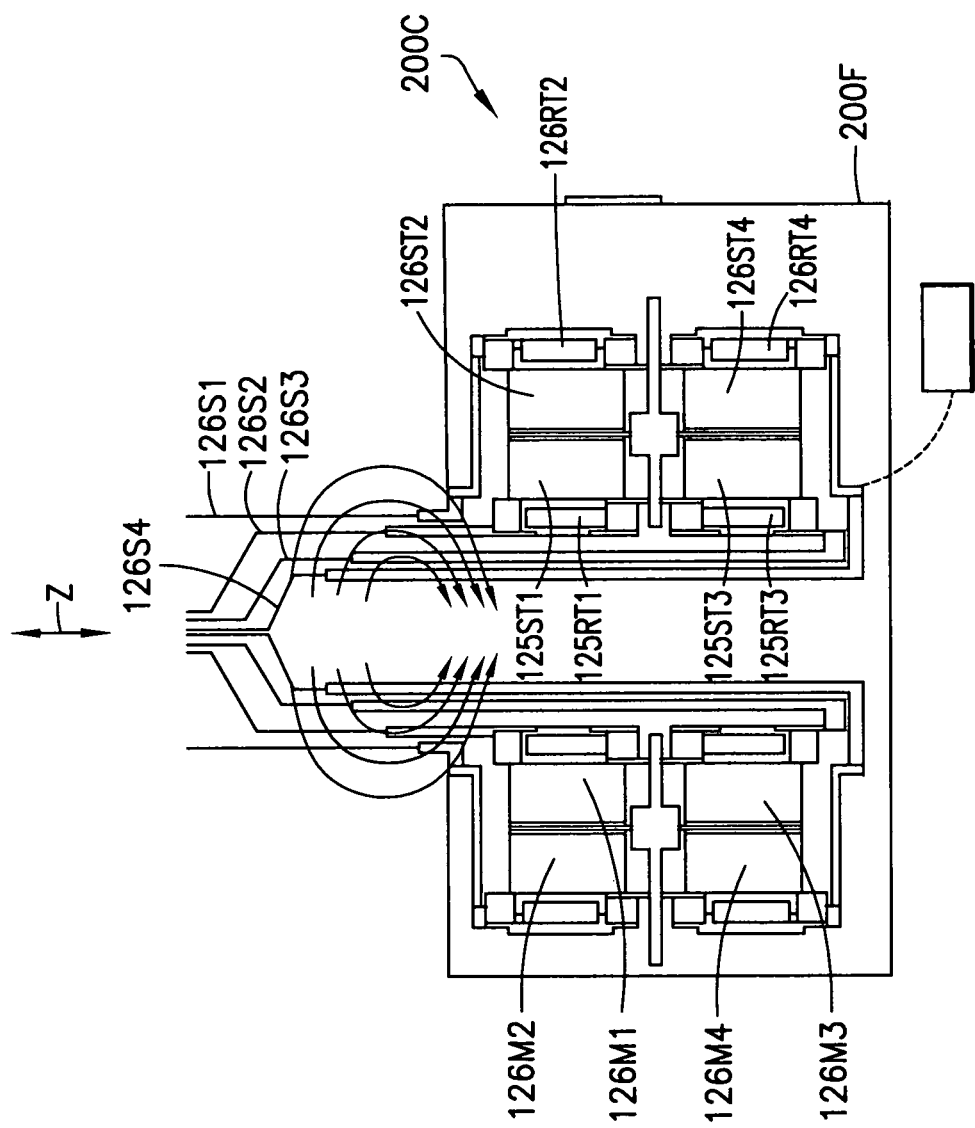
Figure 3A:
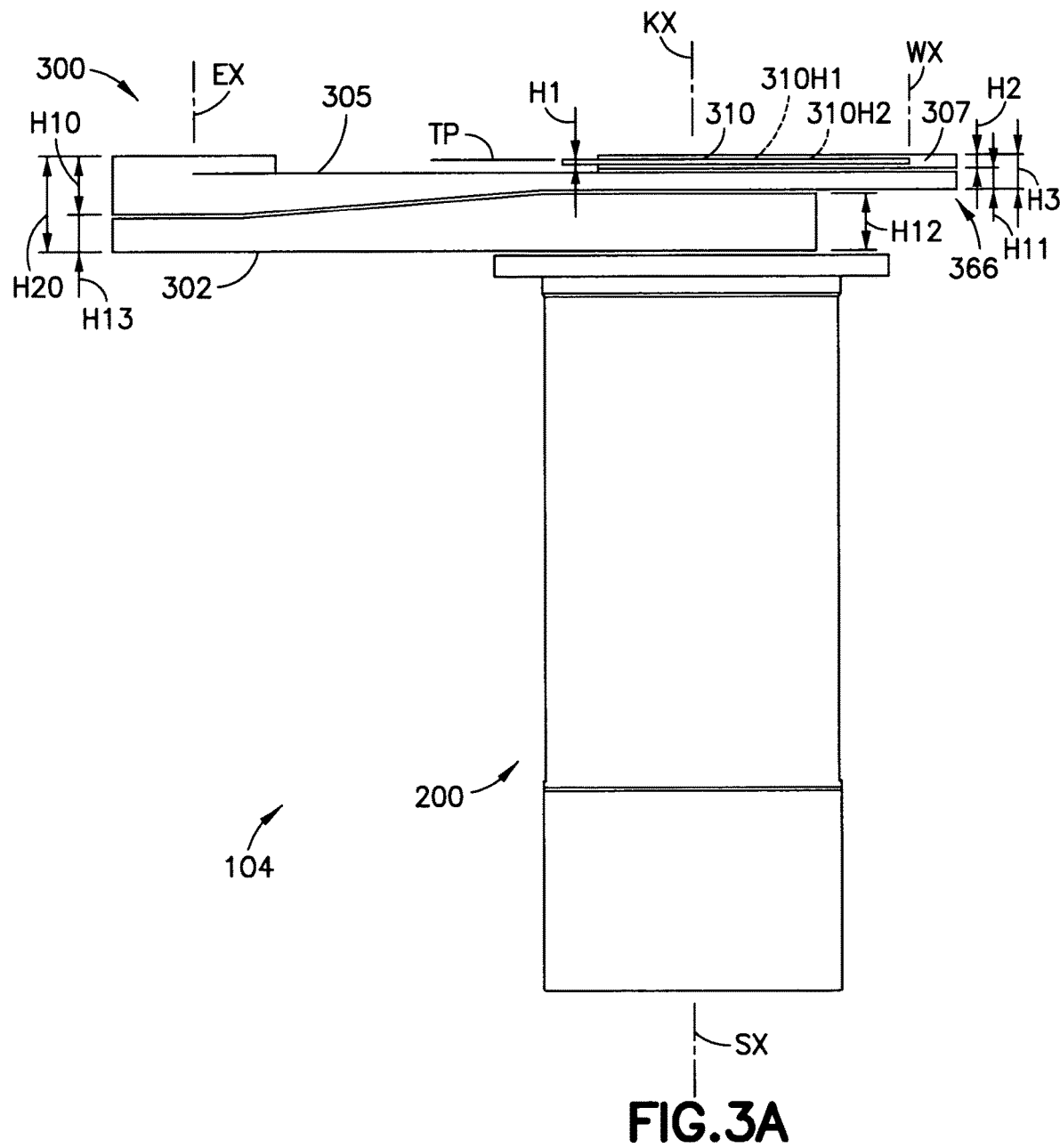
FIGS. 3A-3D are schematic illustrations of a substrate transport apparatus in accordance with aspects of the disclosed embodiment.

Referring now to FIGS. 2A, 2B, 2C, 2D in one aspect the substrate transport apparatus 104 includes at least one drive section (which may also be referred to as a drive system) 200, 200A, 200B, 200C and at least one robot arm 300 (see FIG. 3A). It is noted that the substrate transport apparatus 104 illustrated is exemplary and in other aspects may have any suitable configuration substantially similar to that described in U.S. application Ser. No. 14/568,742 entitled "Substrate transport apparatus" and filed on Dec. 12, 2014, the disclosure of which is incorporated by reference herein in its entirety. One or more robot arms 300 may be coupled to respective drive shafts of one of drive sections 200, 200A-200C as described herein, at any suitable connection CNX so that the rotation of the drive shaft(s) effect movement of the respective transport arm(s) 300. As will be described below, in one aspect, the transport arms 300 are interchangeable from a number of different interchangeable transport arms 300 so as to be swapped one transport arm for another transport arm at the connection CNX with the drive section.

The at least one drive section 200, 200A, 200B, 200C is mounted to any suitable frame of the processing apparatus 100A-100H. In one aspect, as noted above, the substrate transport apparatus 104 may be mounted to a linear slide 144 (FIG. 1C) or boom arm 143 in any suitable manner where the linear slide 144 and/or boom arm 143 has a drive section substantially similar to drive section 200, 200A, 200B, 200C described herein. The at least one drive section 200, 200A, 200B, 200C may include a common drive section that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the transport arms 314, 315, 316, 317, 318 along the Z axis. The Z axis drive is illustrated in FIG. 2A as a screw type drive but in other aspects the drive may be any suitable linear drive such as a linear actuator, piezo motor, etc. The rotational drive section 282 may be configured as any suitable drive section such as, for example, a harmonic drive section. For example, the rotational drive section 282 may include any suitable number of coaxially arranged harmonic drive motors 280, such as can be seen in FIG. 2B where the drive section 282 includes, for example, three coaxially arranged harmonic drive motors 280, 280A, 280B. In other aspects the drives of drive section 282 may be located side-by-side and/or in a coaxial arrangement. In one aspect the rotational drive section 282 shown in FIG. 2A includes one harmonic drive motor 280 for driving shaft 280S however, in other aspects the drive section may include any suitable number of harmonic drive motors 280, 280A, 280B (FIG. 2B) corresponding to, for example, any suitable number of drive shafts 280S, 280AS, 280BS (FIG. 2B) in the coaxial drive system.

The harmonic drive motor 280 may have high capacity output bearings such that the component pieces of a ferrofluidic seal 276, 277, are centered and supported at least in part by the harmonic drive motor 280 with sufficient stability and clearance during desired rotation T and extension R movements of the substrate transport apparatus 104. It is noted that the ferrofluidic seal 276, 277 may include several parts that form a substantially concentric coaxial seal as will be described below. In this example the rotational drive section 282 includes a housing 281 that houses one or more drive motor 280 which may be substantially similar to that described above and/or in U.S. Pat. Nos. 6,845,250; 5,899,658; 5,813,823; and 5,720,590, the disclosures of which are incorporated by reference herein in their entireties. The ferrofluidic seal 276, 277 can be toleranced to seal each drive shaft 280S, 280AS, 280BS in the drive shaft assembly. In one aspect a ferrofluidic seal may not be provided. For example, the drive section 282 may include drives having stators that are substantially sealed from the environment in which the transport arms operate while the rotors and drive shafts share the environment in which the arms operate. Suitable examples, of drive sections that do not have ferrofluidic seals and may be employed in the aspects of the disclosed embodiment include the MagnaTran® 7 and MagnaTran® 8 robot drive sections from Brooks Automation, Inc. which may have a sealed can arrangement as will be described below. It is noted that drive shaft(s) 280S, 280AS, 280BS may also have a hollow construction (e.g., have a hole running longitudinally along a center of the drive shaft) to allow for the passage of wires 290 or any other suitable items through the drive assembly for connection to, for example, another drive section as described in U.S. patent application Ser. No. 15/110,130 filed on Jul. 7, 2016 and published as U.S. 2016/0325440 on Nov. 10, 2016, the disclosure of which is incorporated herein by reference in its entirety, any suitable position encoders, controllers, and/or the at least one transport arm 314, 315, 316, 317, 318, mounted to the drive section 200, 200A, 200B, 200C. As may be realized, each of the drive motors of drive section 200, 200A, 200B, 200C may include any suitable encoders configured to detect a position of the respective motor for determining a position of the end effector 314E, 315E, 316E, 317E1, 317E1, 318E1, 318E2 of each transport arm 314, 315, 316, 317, 318.

In one aspect the housing 281 may be mounted to a carriage 270C which is coupled to the Z axis drive 270 such that the Z axis drive 270 moves the carriage (and the housing 281 located thereon) along the Z axis. As may be realized, to seal the controlled atmosphere in which the transport arms 314, 315, 316, 317, 318 operate from the interior 200FI of the drive section 200, 200A, 200B, 200C (which may operate in an atmospheric pressure ATM environment), the drive section 200, 200A, 200B, 200C may include one or more of the ferrofluidic seal 276, 277 described above and a bellows seal 275. The bellows seal 275 may have one end coupled to the carriage 270C and another end coupled to any suitable portion of the frame 200F so that the interior 200FI of the frame 200F is isolated from the controlled atmosphere in which the transport arms 314, 315, 316, 317, 318 operates.

In other aspects, as noted above, a drive having stators that are sealed from the atmosphere in which the transport arms operate without a ferrofluidic seal, such as the MagnaTran® 7 and MagnaTran® 8 robot drive sections from Brooks Automation, Inc., may be provided on the carriage 270C. For example, referring also to FIGS. 2C and 2D the rotational drive section 282 is configured so that the motor stators are sealed from the environment in which the transport arms operate while the motor rotors share the environment in which the transport arms operate. Referring to FIG. 2C a tri-axial rotational drive section 282 is illustrated. In this aspect there are three motors 280', 280A', 280B', each having a rotor 280R', 280AR', 280BR' coupled to a respective drive shaft 280S, 280AS, 280BS. Each motor 280', 280A', 280B' also includes a respective stator 280S', 280AS', 280BS' which may be sealed from the atmosphere in which the transport arm(s) operate by a respective can seal 280SC, 280ACS, 280BCS. As may be realized any suitable encoders/sensors may be provided for determining a position of the drive shaft (and the arm(s) which the drive shaft(s) operates). As may be realized, in one aspect the drive shafts of the motors illustrated in FIG. 2C may not allow for wire 290 feed-through while in other aspects any suitable seals may be provided so that wires may be passed through, for example, hollow drive shafts of the motors illustrated in FIG. 2C.

Drive section 200C, illustrated in FIG. 2D, includes a four motor nested or concentric configuration such that four drive shafts 126S1-126S4 are arranged coaxially and four motors 126M1-126M4 are arranged in a nested coaxial arrangement. For example, motor 126M1 is nested within (e.g., is radially surrounded by) motor 126M2 and motor 126M3 is nested within motor 126M4. The nested motors 126M1, 126M2 are coaxially arranged relative to nested motors 126M3, 126M4 so that nested motors 126M1, 126M2 are disposed coaxially above nested motors 126M3, 125M4. However, it should be understood that the motors 126M1-126M4 may have any suitable arrangement such as a stacked arrangement, a side by side, or concentric arrangement as shown in FIG. 2D. In other aspects, the motors may be low profile planar or "pancake" style robot drive configuration where the motors are concentrically nested within each other in a manner substantially similar to that described in U.S. Pat. No. 8,008,884 entitled "Substrate Processing Apparatus with Motors Integral to Chamber Walls" issued on Aug. 30, 2011 and U.S. Pat. No. 8,283,813 entitled "Robot Drive with Magnetic Spindle Bearings" issued on Oct. 9, 2012, the disclosures of which are incorporated by reference herein in their entireties.

While the motors are illustrated as rotary motors in other aspects any suitable motor(s) and/or suitable drive transmission(s) may be used such as, for example, a direct drive linear motor, linear piezo electric motors, linear inductance motors, linear synchronous motors, brushed or brushless linear motors, linear stepper motors, linear servo motors, reluctance motors, etc. Examples of suitable linear motors are described in, for example, U.S. patent application Ser. No. 13/286,186 entitled "Linear Vacuum Robot with Z Motion and Articulated Arm" filed on Oct. 31, 2011; Ser. No. 13/159,034 entitled "Substrate Processing Apparatus" filed on Jun. 13, 2011 and U.S. Pat. No. 7,901,539 entitled "Apparatus and Methods for Transporting and Processing Substrates" issued Mar. 8, 2011; U.S. Pat. No. 8,293,066 entitled "Apparatus and Methods for Transporting and Processing Substrates" issued Oct. 23, 2012; U.S. Pat. No. 8,419,341 entitled "Linear Vacuum Robot with Z Motion and Articulated Arm" issued Apr. 16, 2013; U.S. Pat. No. 7,575,406 entitled "Substrate Processing Apparatus" issued Aug. 18, 2009; and U.S. Pat. No. 7,959,395 entitled "Substrate Processing Apparatus" issued Jun. 14, 2011, the disclosures of which are incorporated herein by reference in their entireties.

Figure 3B:
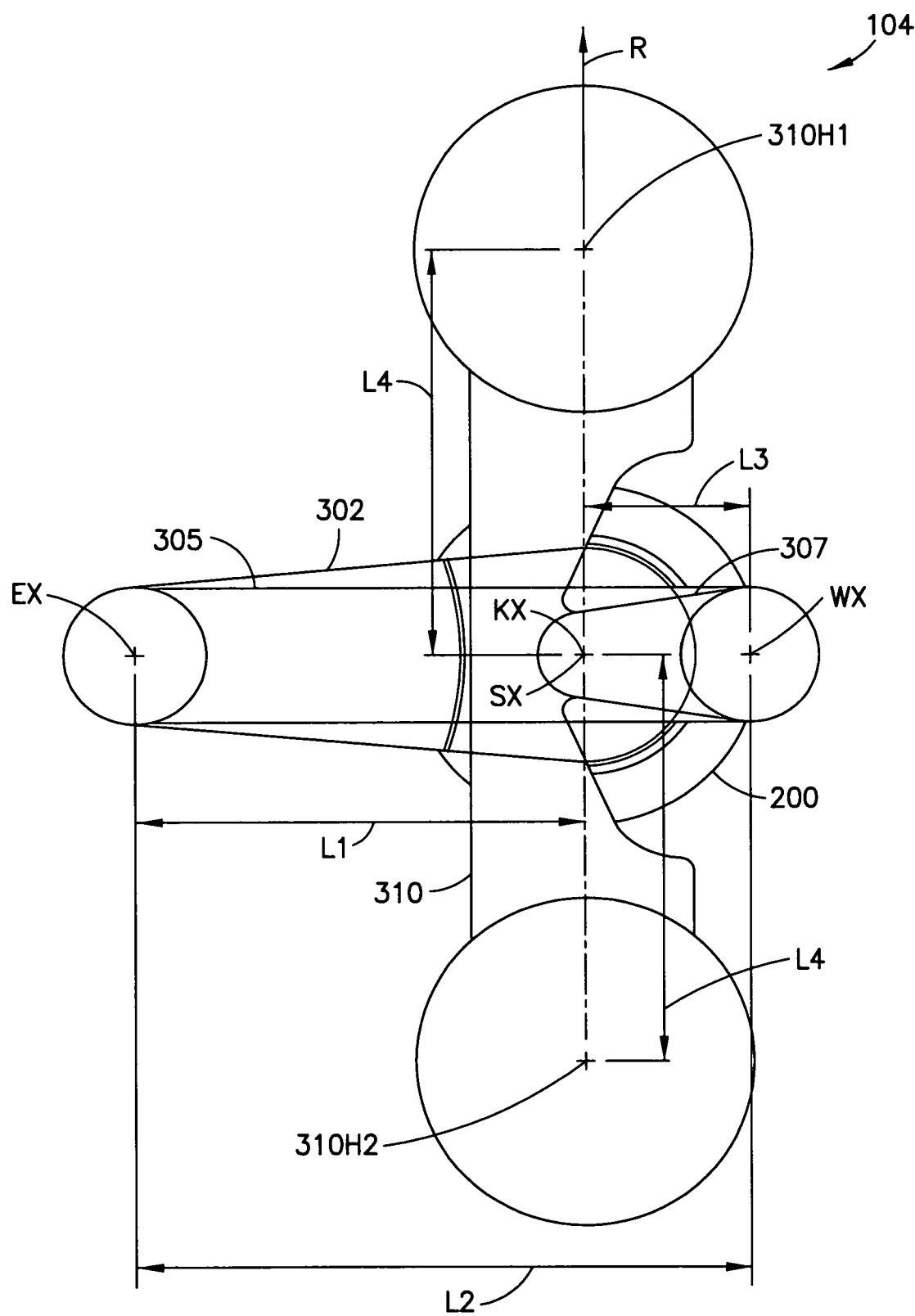

Referring now to FIGS. 1D and 1G-1J, the boom arm 143 may include any suitable arm linkage mechanism(s). Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transport arm 300 of each substrate transport apparatus 104, the boom arm 143 and/or the linear slide 144 may be derived from a conventional SCARA arm (selective compliant articulated robot arm) type design, which includes an upper arm, a band-driven forearm and a band-constrained end-effector, or from a telescoping arm or any other suitable arm design, such as a Cartesian linearly sliding arm 314 (FIG. 3B). Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on January 19, 100G, the disclosures of which are incorporated by reference herein in their entireties.

The operation of the transport arms 300 (where multiple arms are included in the substrate transport apparatus 104) may be independent from each other (e.g., the extension/retraction of each arm is independent from other arms), may be operated through a lost motion switch or may be operably linked in any suitable way such that the arms share at least one common drive axis. Suitable examples of lost motion switches are described in, for example, U.S. Pat. No. 7,946,800 issued on May 24, 2011 and U.S. Pat. No. 8,752,449 issued on Jun. 17, 2014, the disclosures of which are incorporated herein by reference in their entireties. Any suitable controller, such as controller 110, is coupled to the drive section 200, 200A, 200B, 200C in any suitable manner to drive the drive section 200, 200A, 200B, 200C so as to effect the articulation of the transport arm(s) 300.

Figure 3C:
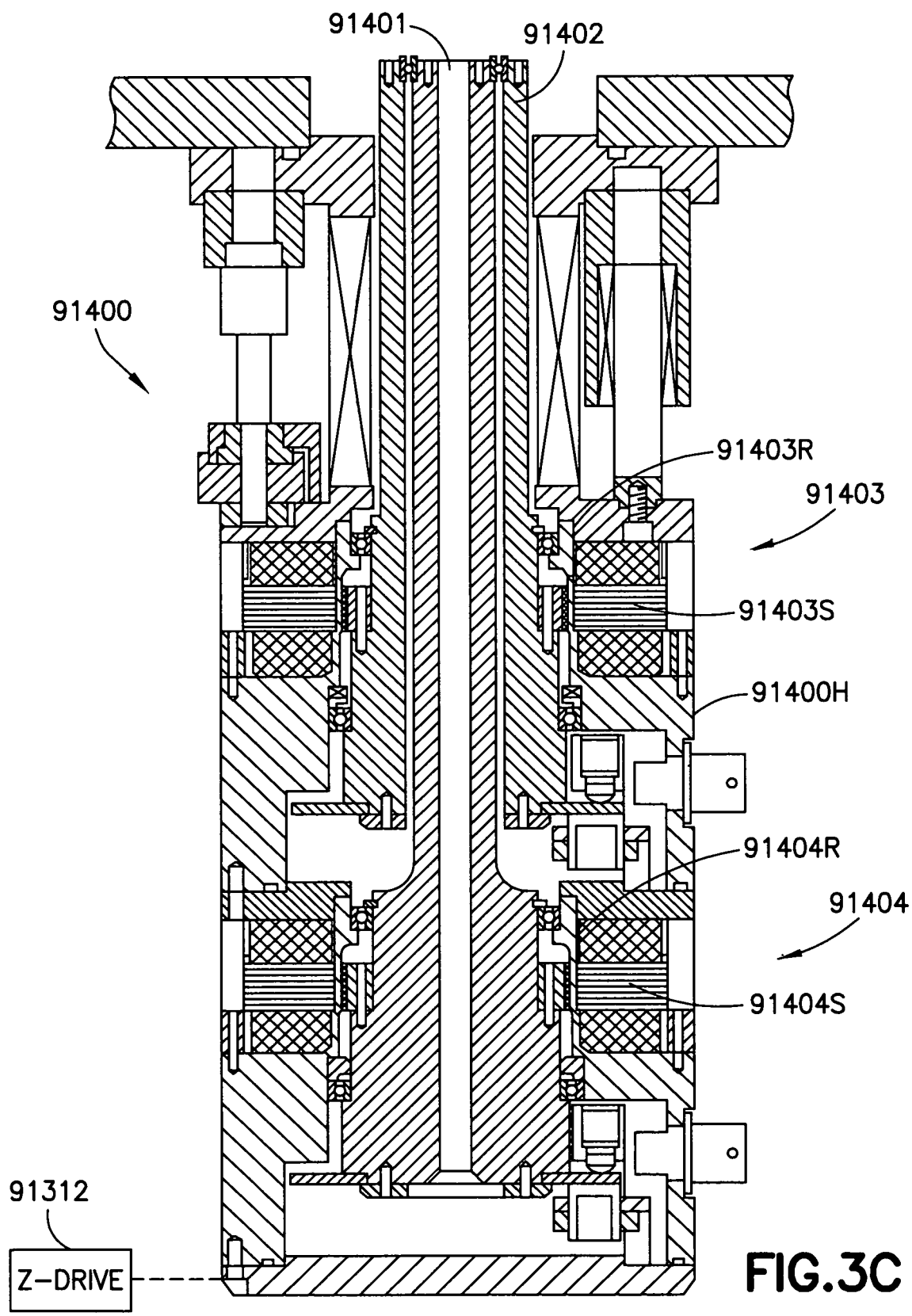
Figure 3D:
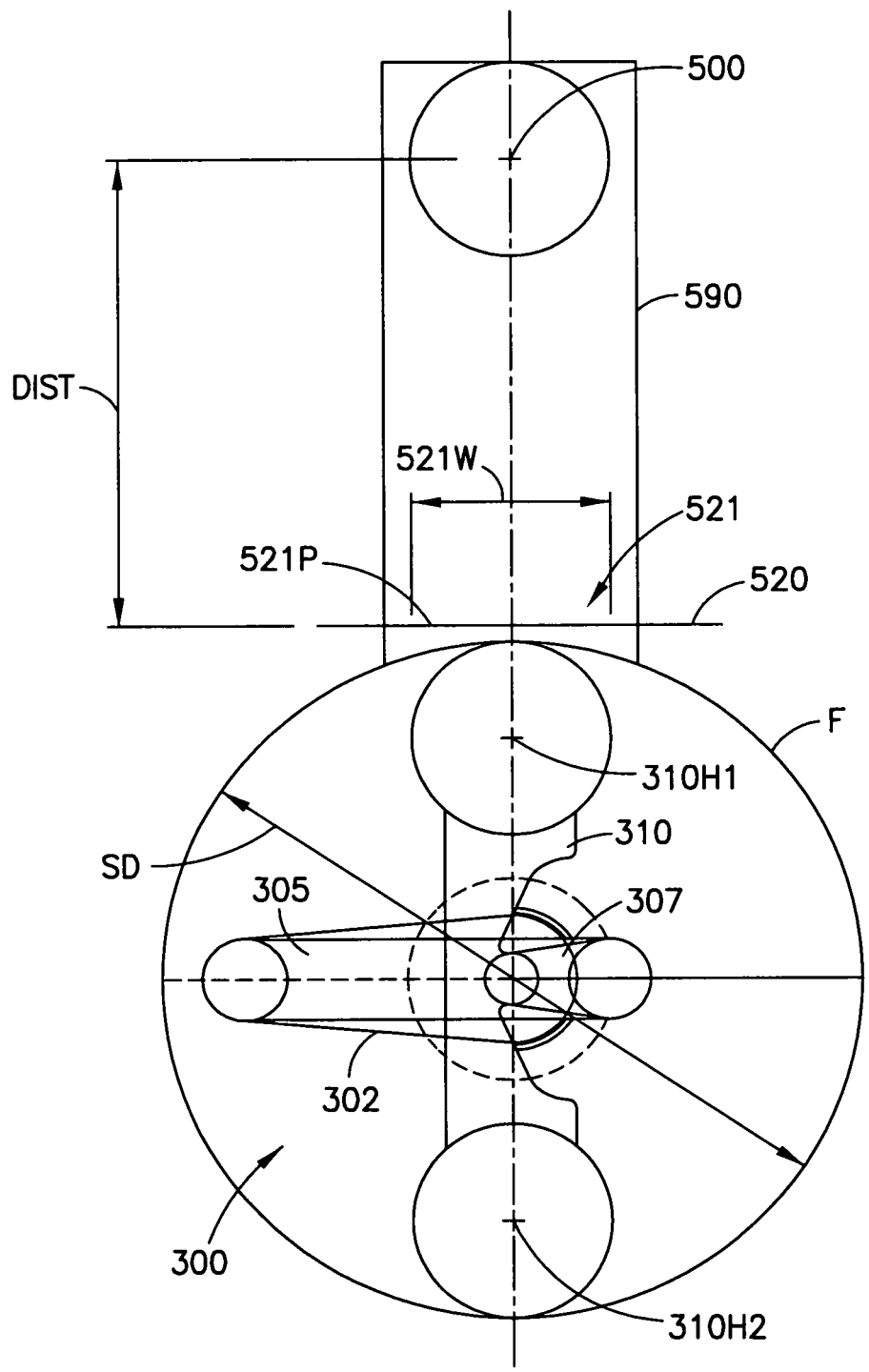
Figure 4A:
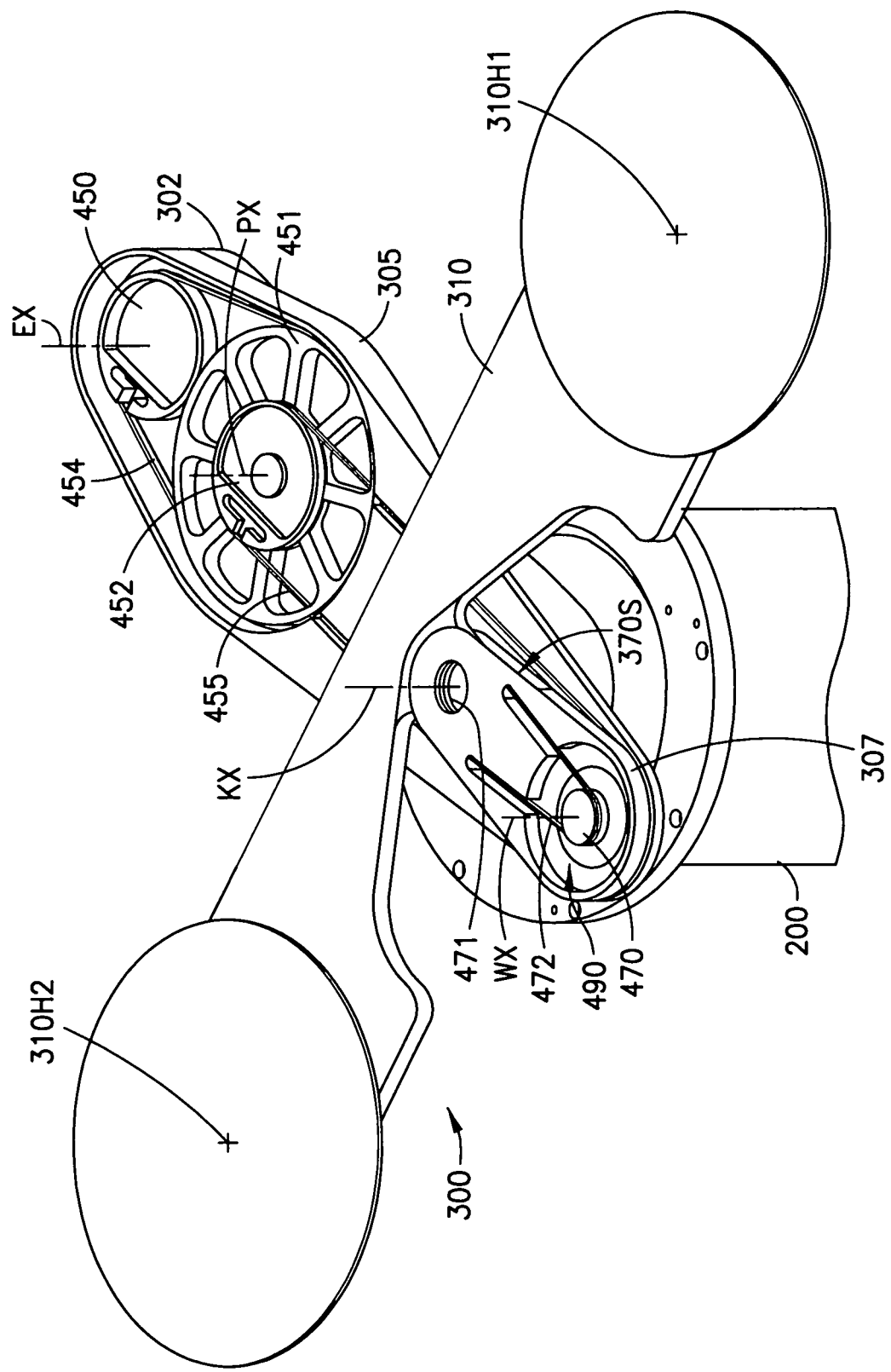
FIGS. 4A-4E are schematic illustrations of portions of a substrate transport apparatus in accordance with aspects of the disclosed embodiment.
Figure 4B:
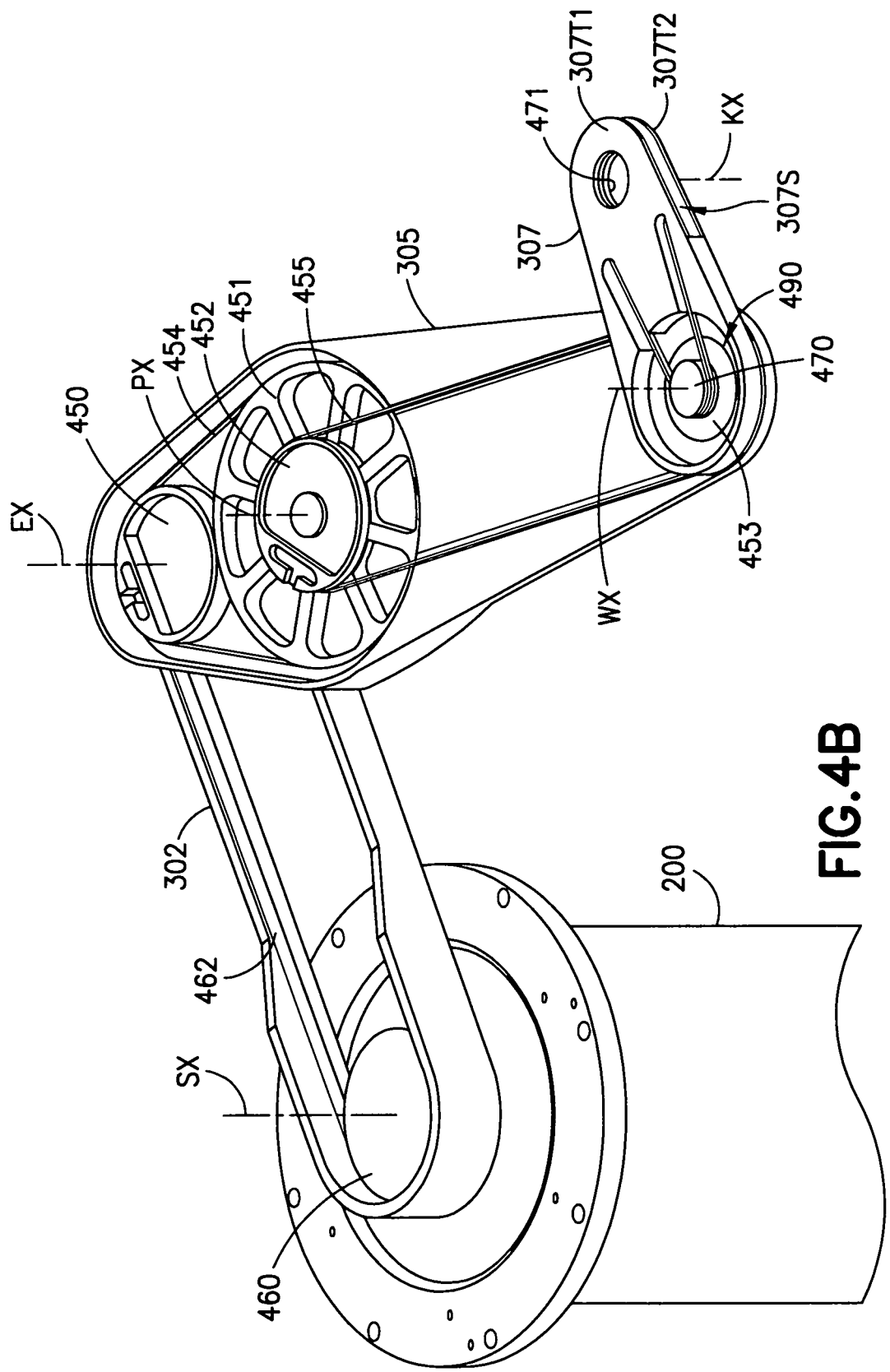

Referring now to FIGS. 3A, 3B, and 3D, in one aspect, the transport arm 300 of the transport apparatus 104 is a three link arm with an end effector 310 having, for example, two or three degrees of freedom as shown in FIG. 3D where the transport arm 300 has a compact configuration with a compact footprint compared to arm reach as will be described herein. The transport arm 300 includes an upper arm link 302, a forearm link 305, a third arm link 307 (also referred to as a truncated arm link), and an end effector 310 that are serially coupled to each other as described below. While three arm links are illustrated in the figures in other aspects the transport arm 300 may have more than three serially coupled arm links with the end effector being coupled to and supported by the last serially coupled link (i.e., a wrist link arm that is substantially similar to the third arm link 307) in a manner similar to that described with respect to the third arm link 307. The end effector 310 may be a double-ended end effector (such as shown in FIGS. 3B and 4A) having at least one substrate holding location 310H1, 310H2 disposed on opposite sides of an axis of rotation (e.g., knuckle axis KX) of the end effector 310. For example, at least substrate holding location 310H1 of end effector 310 is located on one side of the knuckle axis KX while at least substrate holding location 310H2 of end effector 310 is located on the opposite of the knuckle axis KX, where the at least one substrate holding location 310H1, 310H2 on the opposite sides of the knuckle axis KX are on a common transfer plane TP (see FIG. 3A). In this aspect of the disclosed embodiment the transport apparatus 104 is driven by a two axis (e.g. two degree of freedom) drive section 91400 (FIG. 3C) such that rotation of the end effector 310 is slaved to the rotation of the forearm link 305 and rotation of the truncated arm link 307 is slaved to rotation of the upper arm link 302 as will be described below, where one axis of the two axis drive section 91400 drives rotation of the upper arm link 302 and another axis of the two axis drive section 91400 drives rotation of the forearm link 305. In other aspects, such as where the transport apparatus 104 includes more than three arm links and an end effector coupled thereto, the rotation of the arms may be slaved in any suitable manner such that the arm extends, retracts, and rotates about a shoulder axis with only the two degree of freedom drive section 91400. It is noted that the two axis drive section 91400 may be substantially similar to the drive systems described above but with only two drive axes. For example, the drive section 91400 may include a first motor 91403 and a second motor 91404 each including a respective stator 91403S, 91404S and rotor 91403R, 91404R. The stators 91403S, 91404S may be rotationally fixed and mounted to housing 91400H of the drive section 91400. The rotor 91403R may be mounted to drive shaft 91402 and rotor 91404R may be mounted to drive shaft 91401. While the drive shafts are shown as coaxial drive shafts and the motors are shown as being stacked one above the other in other aspects of the disclosed embodiment one or more of the drive shafts and motors may have a side by side arrangement and be coupled to each other through suitable transmissions such as belts, bands, gears, etc. The drive section 91400 may also include at least one Z-axis drive 91312 for vertically moving the arm assembly of the transport apparatus 90100 as a unit or for vertically moving, for example, each end effector 85104, 85105 vertically independent of the other end effector 85104, 85105.

Referring also to FIGS. 3B and 4A-4C, the upper arm link 302, the forearm link 305, and the truncated arm link 307 are unequal lengths. For example, the upper arm link 302 has a length L1 from joint center to joint center (e.g., from the shoulder axis SX to the elbow axis EX), the forearm link 305 has a length L2 from joint center to joint center (e.g., from the elbow axis EX to the wrist axis WX), and the truncated arm link 307 has a length L3 from joint center to joint center (e.g., from wrist axis EX to knuckle axis KX) where the length L3 is less than the length L1 and the length L1 is less than the length L2. In other aspects the lengths L1-L3 (from joint center to joint center) may be any suitable lengths. It is noted that while the shoulder axis SX and the knuckle axis KX may be illustrated as being coaxial with the transport arm 300 is in the retracted configuration (e.g., shown in FIG. 3B), in other aspects the shoulder axis SX and the knuckle axis KX may not be coaxial with the transport arm 300 in the retracted configuration noting that the location of the knuckle axis KX relative to the shoulder axis SX may depend on a length L1-L3 of one or more of the upper arm link 302, the forearm link 305, and the truncated arm link 307. The arm link lengths L1-L3 and a length L4 of the end effector (e.g., where the length L4 is from the knuckle axis KX to a substrate holding location 310H1, 310H2 of the end effector 310), and hence the transport arm 300, are configured to provide a long reach capable of accessing a deep set substrate holding station 500 (see FIGS. 3D and 5A) of a processing module 590, where the deep set substrate holding station 500 is disposed within the processing module 590 so that an offset distance DIST (i.e., where the distance DIST is disposed along an axis of extension and retraction R of the transport arm 300 from an inside face 520 of the transport chamber 580 gate (or slot) valve 521 port (or pass through) 521P to the deep set substrate holding station 500) is consistent with and accommodated by extension of at least part of the forearm link 305 length L2 holding the wrist joint (i.e., at the wrist axis WX), the truncated arm link 307 length L3 and the length L4 of end effector 310 from the knuckle axis KX (for a small footprint three link with end effector transport arm 300) extending through the inside face of the transport chamber gate valve port 590P. The long reach of the transport arm 300 is comparable to a four link SCARA arm (selective compliant articulated robot arm) with the joint coupling the second and third links of the four link SCARA arm traversing through the port 251P of the slot valve 521.

The unequal lengths of the upper arm link 302, forearm link 305 and truncated arm link 307, for example, may allow the swing diameter of the arm assembly, while in a retracted position, to remain the same as the swing diameter of a conventional arm assembly with an upper arm and forearm being of equal lengths. However, the unequal lengths of the upper arm link 302, forearm link 305 and truncated arm link 307 of the transport arm 300 in the disclosed embodiment may allow, for example, a greater reach (i.e. a greater extension) than an arm having equal length links with the same swing diameter thus, increasing the reach to containment ratio of the transport arm 300. For example, the transport arm 300 (and hence the substrate transport apparatus 104) has a reach that is a maximum reach of the substrate transport apparatus 104 for a predetermined swing diameter SD of the substrate transport apparatus 104 with the upper arm link 302, the forearm link 305, the truncated arm link 307, and the end effector 310 in a retracted configuration (such as shown in FIG. 3D), which maximum reach extends the end effector 310, its knuckle axis KX, and at least part of the truncated arm link including the wrist axis WX through the gate (or slot) valve 521 (see FIG. 5A) of the substrate processing module or apparatus 590. FIG. 3D shows the swing diameter SD (i.e. footprint illustrated by circle F) of the transport arm 300. As may be realized, the swing diameter's value of a SCARA arm in general is determined, for example, by either the combination of the substrate holder offset, wafer diameter, wrist radius or the upper arm's elbow swing radius. Hence, for the same length substrate holder offset, a conventional SCARA arm and transport arm 300 would have substantially the same footprint. For example, the forearm link 305 of the disclosed embodiment is able to grow longer than the upper arm link 302 and the truncated arm link 307 to a maximum ratio established by the constraints of the system (e.g. the desired footprint). In addition, in aspects of the disclosed embodiment the upper arm link 302, forearm link 305, truncated arm link 307 and/or end effector 310 may be independently rotatable and driven by separate motors, such as of, e.g., drive sections 200B, 200C, as will be described below. In alternate embodiments, one or more of the arm assembly arm sections may not be independently rotatable, such as where one or more of the arm links are slaved or driven by a respective degree of freedom, such as of, e.g., drive sections 200, 200A, 200B, 200C. As an example of all links being independently rotatable, and referring to drive section 200C, the upper arm link 302 may be coupled to the drive shaft 12651 in a manner similar to that described herein, the upper arm link 302 may be coupled to drive shaft 12652 through any suitable transmission as described herein, the truncated arm link 307 may be coupled to drive shaft 12653 by any suitable transmission similar to those described herein, and end effector 310 may be coupled to drive shaft 12564 by any suitable transmission similar to those described herein.

Still referring to FIGS. 3A-4C, the upper arm link 302 is coupled to, for example, drive shaft 91402 about the shoulder axis SX so that the drive shaft 91402 and the upper arm link 302 rotate as a unit. The forearm link 305 is rotatably coupled to the upper arm link 302 about the elbow axis EX. The third or truncated arm link 307 is rotatably coupled to the forearm link 305 about the wrist axis WX. The end effector 310 is rotatably coupled to the third or truncated arm link 307 about the knuckle axis KX (i.e., the end effector 310 rotates with respect to the third link 307) and is aligned with (e.g., a center point of the substrate holding locations 310HA, 310H1 travel along the axis of extension and retraction R—see FIG. 3B) the axis of extension and retraction R.

As described above, the end effector 310 is slaved to the rotation of the forearm link 305 by any suitable transmission 490. For example, a first wrist pulley 470 is rotationally fixed to the forearm link 305 about the wrist axis WX. A second wrist pulley 471 is rotatably coupled to the truncated arm link 307 about the knuckle axis KX and is driven by the first wrist pulley 470 through one or more bands 472. The bands 472 may be arranged at the same height/elevation (i.e., a single band height) in a manner similar to that shown in FIG. 4E so that the stack height of the truncated arm link 307 and the forearm link 305 at and adjacent the wrist axis WX is less than a height of a port 521P of a slot valve 521 (see FIG. 5A) so that the wrist axis extends through the port 521P as described herein. The second wrist pulley 471 is rotationally fixed to the end effector 310 so that the second wrist pulley 471 and the end effector rotate about the knuckle axis KX as a unit. A diameter ratio between the first wrist pulley 470 and the second wrist pulley 471 is about 1:2. In other aspects, the first and second wrist pulleys may have any suitable diameter ratio.

The forearm link is driven by the drive shaft 91401 through any suitable transmission 475. For example, the drive shaft 91401 is coupled to a first upper arm pulley 460 so that the first upper arm pulley 460 rotates as a unit with the drive shaft 91401. A second upper arm pulley 461 is rotationally coupled to the upper arm link 302 about the elbow axis EX and is driven by the first upper arm pulley by band 462. The second upper arm pulley 461 is rotationally fixed with the forearm link 305 so that the forearm link 305 and the second upper arm pulley are driven by the drive shaft 91401 and rotate as a unit about the elbow axis EX. The diameter ratio between the first upper arm pulley 460 and the second upper arm pulley 461 is about 1:1. In other aspects, the first upper arm pulley 460 and the second upper arm pulley 461 may have any suitable diameter ratio.

The truncated arm link 307 is slaved to the upper arm by any suitable transmission 480. For example, a first forearm pulley 450 is rotationally fixed to the upper arm link 302 so as to move as unit with the upper arm link 302. A second forearm pulley 451 (e.g., a first intermediate pulley) is rotatably coupled to the forearm link 305 at pulley axis PX which is located between the elbow axis EX and the wrist axis WX. The second forearm pulley 451 is driven by the first forearm pulley 450 through band 454. A third forearm pulley 452 (e.g., second intermediate pulley) is coupled to the second forearm pulley 451 so as to rotate as a unit with the second forearm pulley 451 about the pulley axis PX. A fourth forearm pulley 453 is rotatably coupled to the forearm link 305 about the wrist axis and is driven by the third forearm pulley 452 by band 455. The fourth forearm pulley 453 is coupled to the truncated arm link 307 so that the fourth forearm pulley 453 and the truncated arm link 307 rotate as a unit about the wrist axis WX. As such, the truncated arm link 407 is slaved to the upper arm link 302 by dual sets of forearm pulleys. In other aspects, the dual sets of forearm pulleys may be coupled to a respective degree of freedom of drive sections 200A-200C in any suitable manner such as were the truncated arm link 307 is provided with independent rotation. Here the third or truncated arm link 307 is rotated about 90° (e.g., +/−45° from the home pose) with the band 455 (i.e., disposed on a single band level) when the transport arm 300 is bi-directionally extended on opposite sides of the shoulder axis SX as described herein, where radial extension of the transport arm 300 is substantially symmetric on the opposite sides of the shoulder axis SX. The diameter ratio between the first forearm pulley 450 and the second forearm pulley 451 is about 1:2. In other aspects, the first forearm pulley 450 and the second forearm pulley 451 may have any suitable diameter ratio. The diameter ratio between the third forearm pulley 452 and the fourth forearm pulley 453 is about 1:1. In one aspect, the diameter ratio between the first forearm pulley 450 and the fourth forearm pulley 453 is about 1:1 and a ratio of the rotation of the wrist about the wrist axis $\theta_{WRA}$ to the rotation of the forearm about the forearm axis $\theta_{FA}$ is about 1:2 (i.e., with respect to extension and retraction along axis of extension and retraction R with, e.g., a two degree of freedom drive). In other aspects, the third forearm pulley 452 and the fourth forearm pulley 453 may have any suitable diameter ratio. In other aspects, there may be only two forearm pulleys (e.g., the first forearm pulley 450 and the fourth forearm pulley 453 where the fourth forearm pulley 453 is driven by the first forearm pulley 450). The dual sets of forearm pulleys (e.g., the first set being pulleys 450, 451 and the second set being pulleys 452, 453) provide for a stiffer motion of at least the truncated arm link 307 (compared to driving pulley 453 with pulley 450 directly) and for the use of singe band height for bands 454, 455 allowing for taller bands to be used. The dual sets of forearm pulleys also provides for pulley reduction (i.e., in rotational speed and increase in torque) within the forearm link 305 so as reduce a height and width of the truncated arm link 307 for passage through the port 521P with the end effector 310 as described herein. Here the wrist joint stack height H3 is independent of (i.e., decoupled from) the reduction pulley height (e.g., the height of pulleys 450, 451, 452) and the wrist joint width 497 is independent of (i.e., decoupled from) the reduction pulley major radius/diameter (e.g., the radius 496R/diameter 496D of pulley 496). The bands 454, 455, 462, 472 may be substantially similar to those described in U.S. Pat. No. 5,682,795 issued on Nov. 4, 1997 and 5,778, 730 issued on Jul. 14, 1998 as well as those described in U.S. pre-grant publication number 2018/0019155, published on Jan. 18, 2018 (application Ser. No. 15/634,87), the disclosures of which are all incorporated herein by reference in their entireties.

Figure 4C:
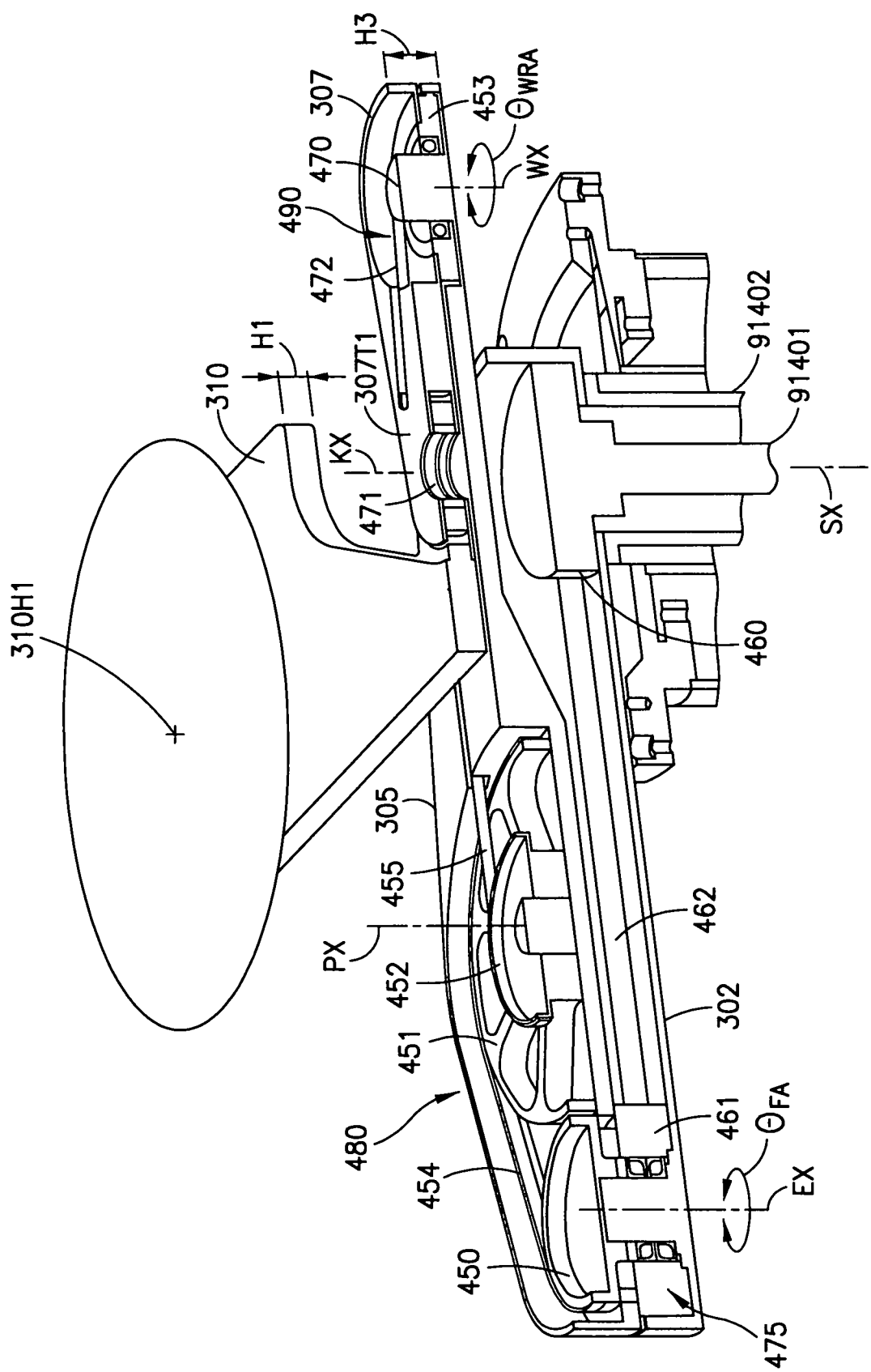
Figure 4D:
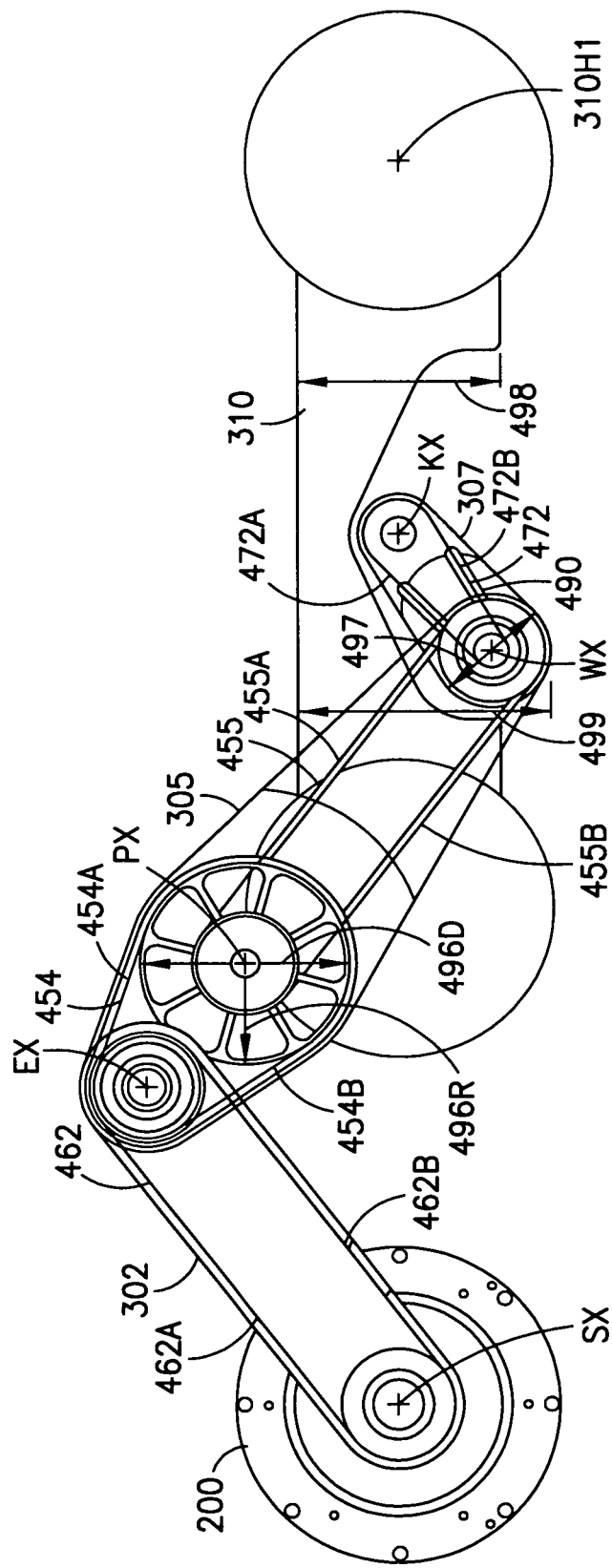
Figure 5A:
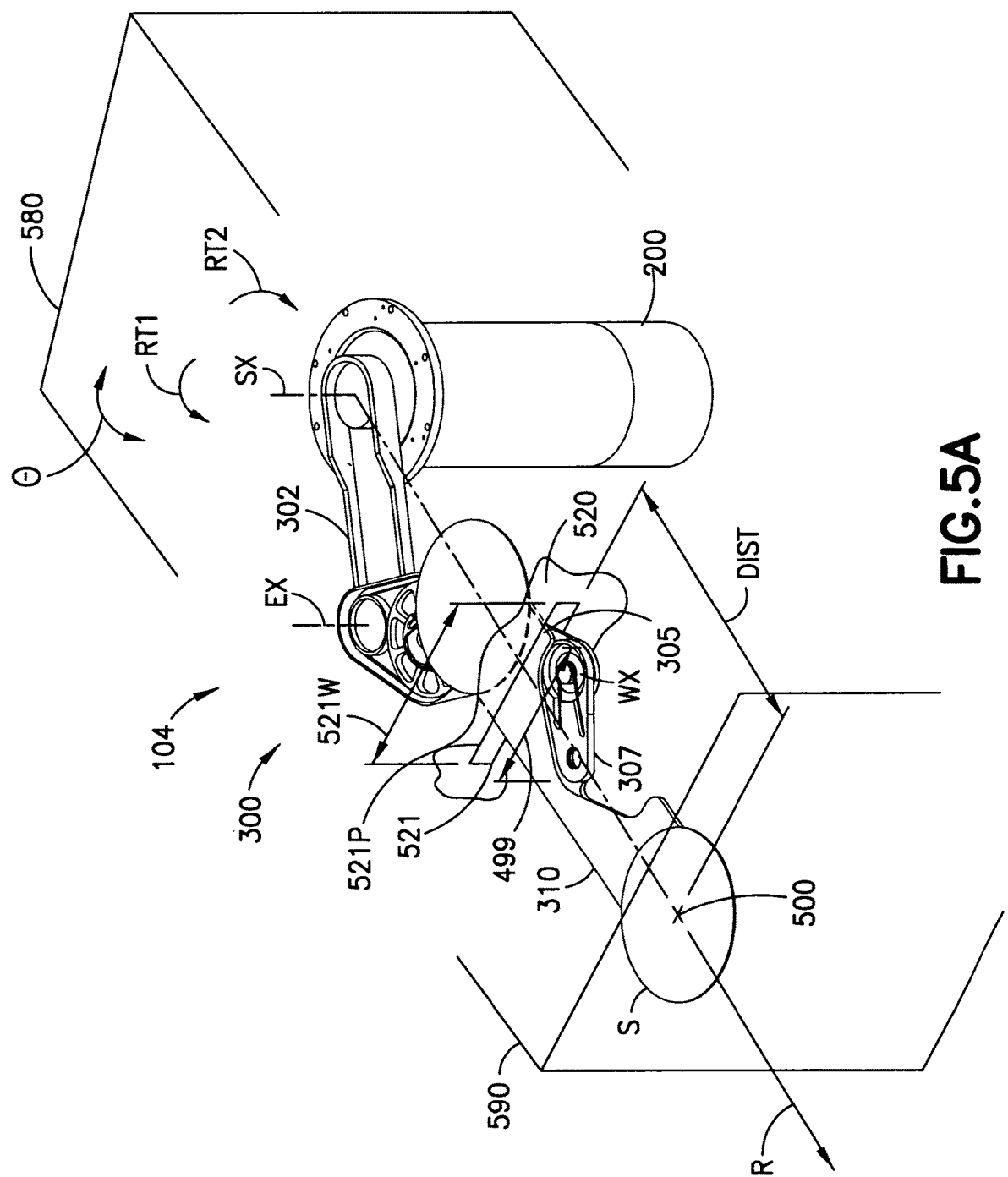
Figure 5B:
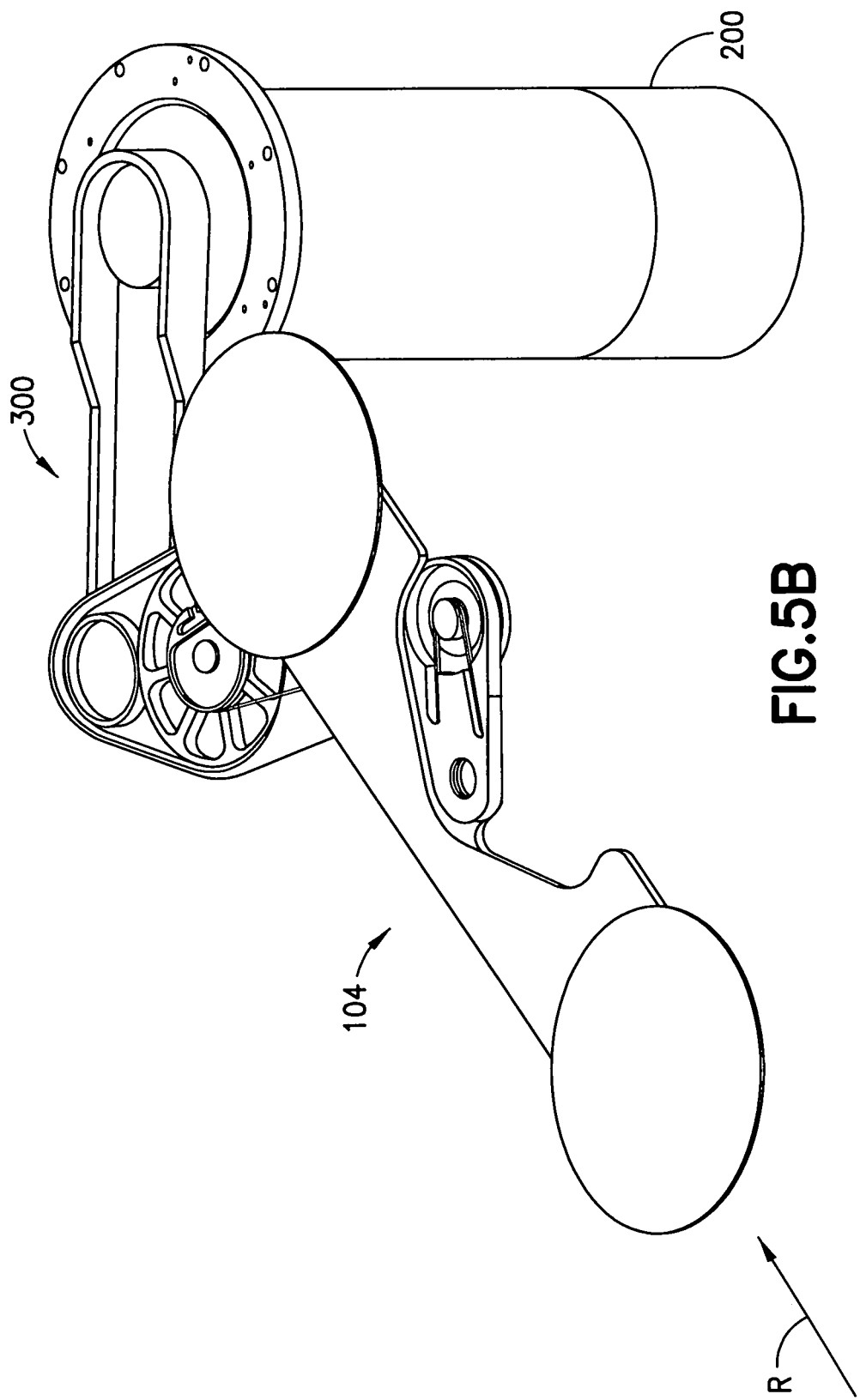
Figure 5C:
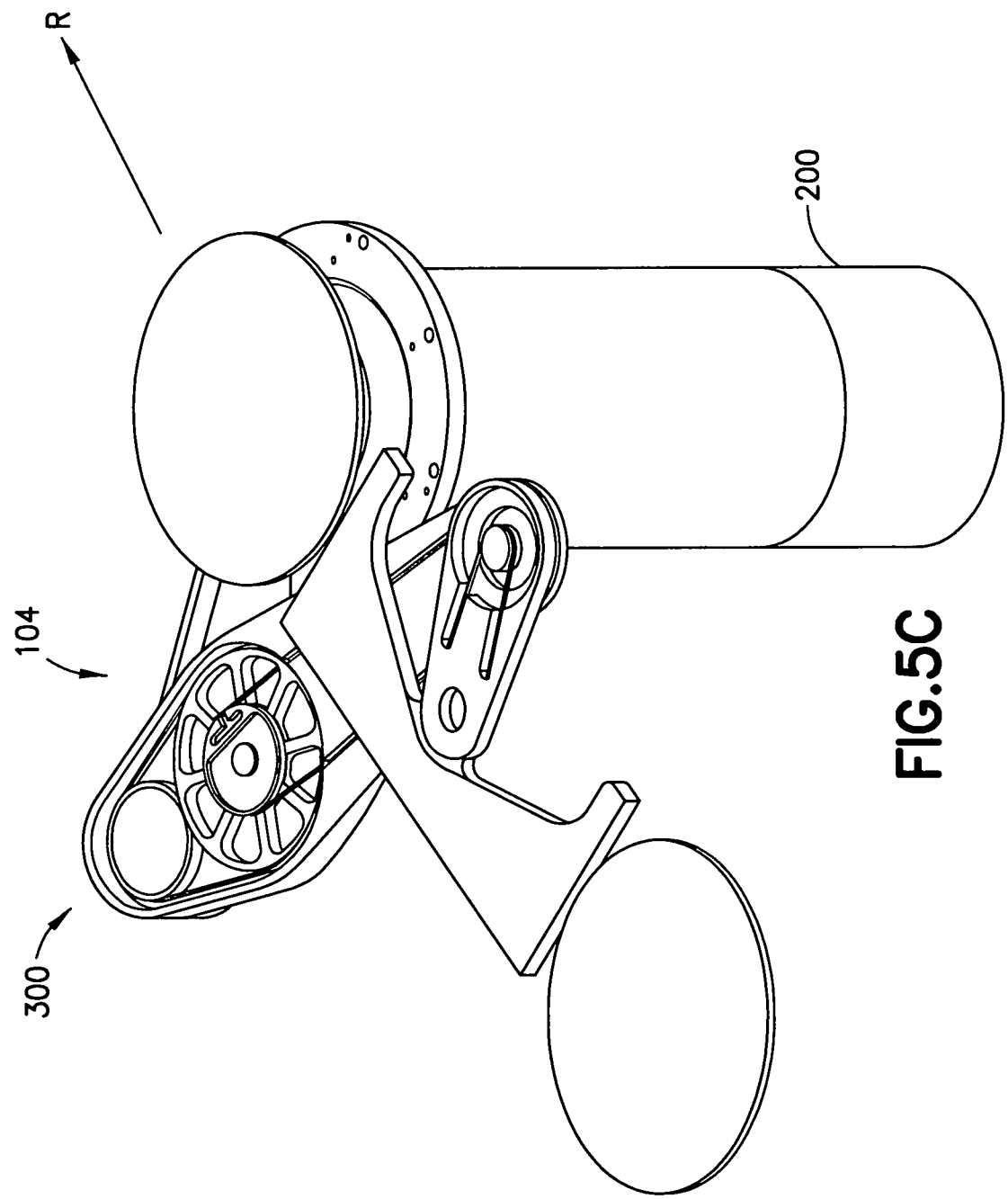
Figure 5D:
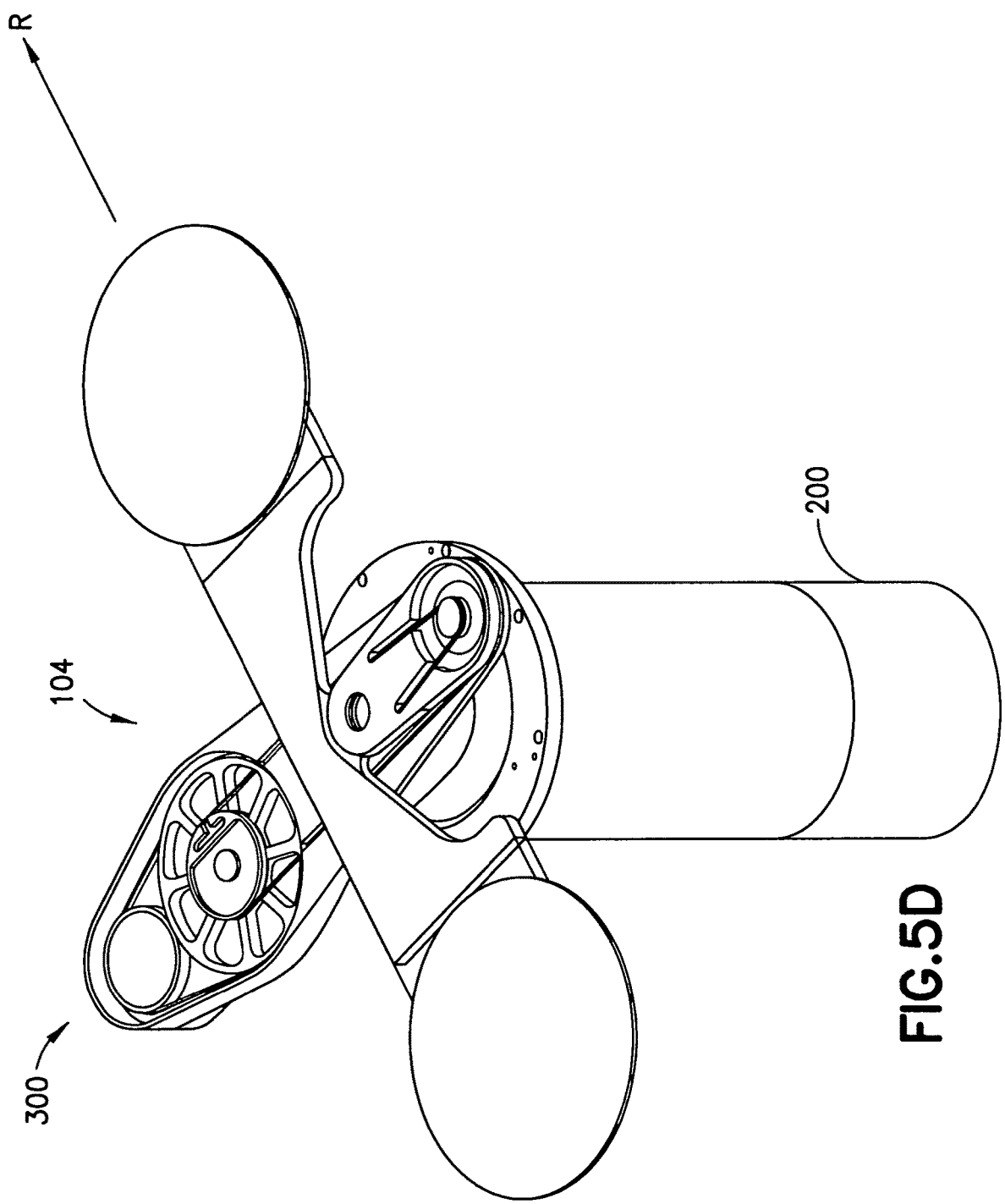
Figure 5F:
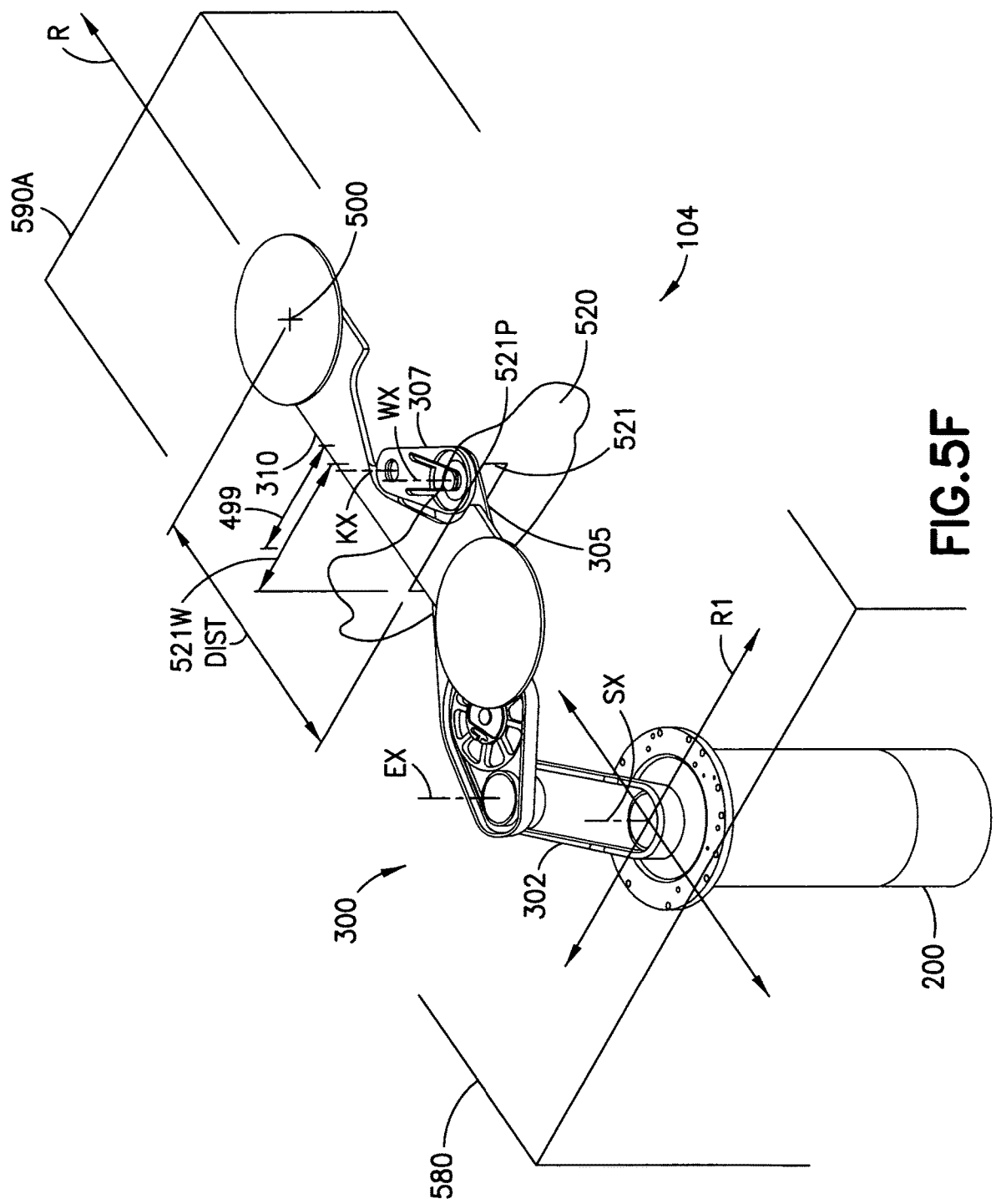

As can be seen in FIGS. 3A and 4A-4C, the truncated arm link 307 and the end effector 310 are configured so that height H1 of the end effector 310 and a height H2 of the truncated arm link 307 is within the stack height profile 366 of the wrist axis WX (e.g., the wrist axis WX (or wrist joint) shares a same elevation with the arm link coupled to the wrist axis WX (i.e., the wrist link arm which in one aspect is the third or truncated arm link 307)) so that a total stack height H3 of the end effector 310 and wrist axis WX is sized to conform within a pass through (e.g., the port 520P) of the slot valve 521 (see, e.g., FIGS. 4C, 5A and 5F). For example, the wrist axis WX is substantially included in the height H2 of the wrist link arm (which in one aspect is the truncated arm link 307). Similarly, the knuckle axis KX (or knuckle joint) is included into the wrist link arm and shares a same elevation with the wrist link arm (see, e.g., FIG. 4C). Referring to FIG. 4D, the wrist axis WX may share (i.e., is included at least partially within) a width 498 of the end effector 310 so that the end effector 310 and the wrist axis WX jointly pass through port 521P of slot valve 521 in a common pass (e.g., together side by side) in a straight line movement of the end effector. For example, a combined width 499 of the end effector 310 and the wrist axis WX is less than a width 521W of the port 521P (see FIGS. 5A and 5F) with the end effector 310 extending along the axis of extension and retraction R.

Figure 4E:
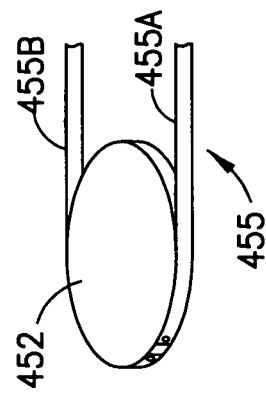
Figure 6A:
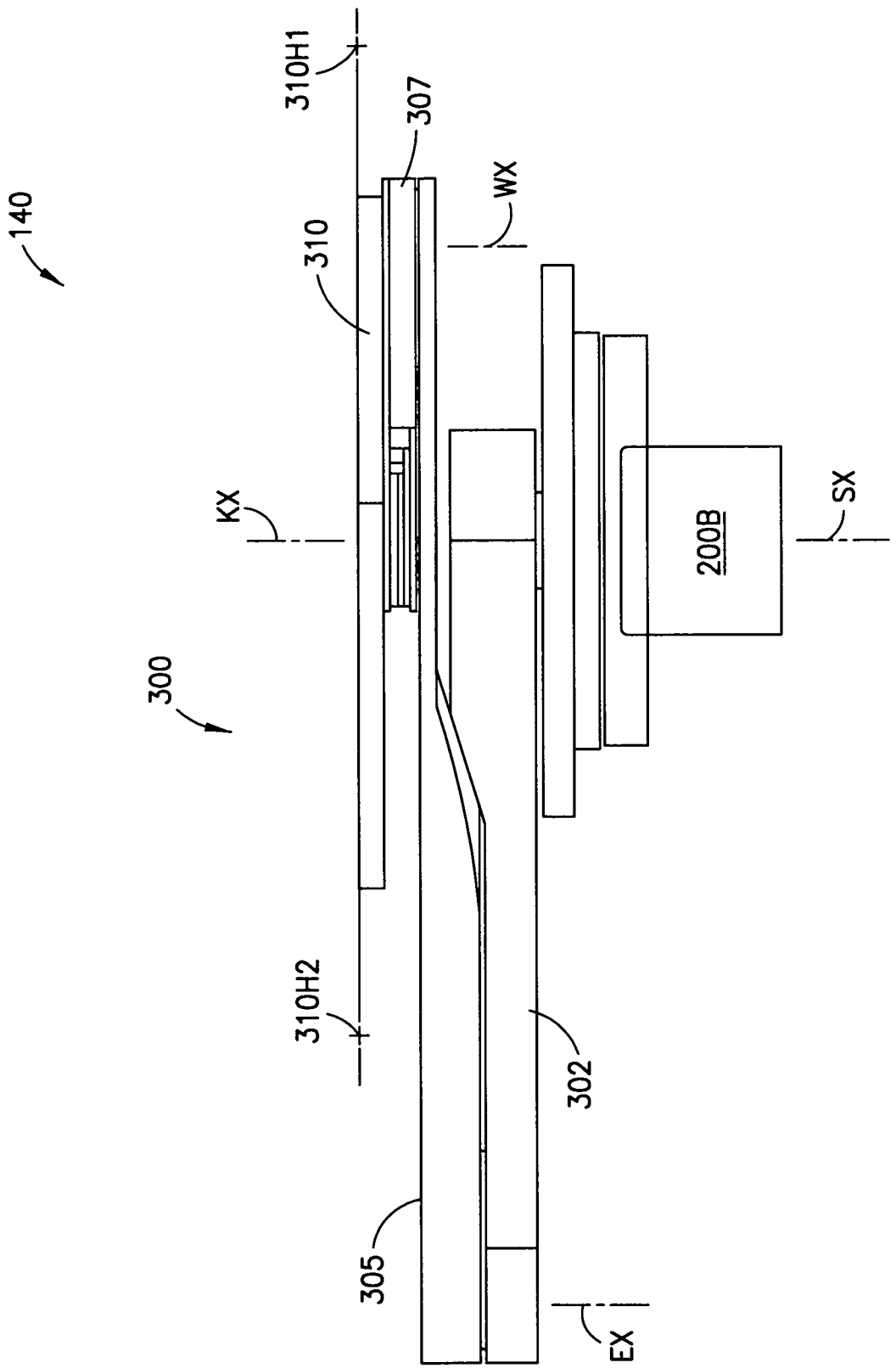

In one aspect, the truncated arm link 307 includes tines 307T1, 307T2 that form a slot 307S (see FIGS. 4B and 4C) that is sized so that at least a portion of the end effector 310 is rotatably disposed within the slot 307S (see FIG. 4A) to effect the total stack height H3. In other aspects, the end effector 310 may be mounted above (see FIG. 6A) or below the truncated arm link so as to effect the total stack height H3. As can also be seen, the rotation of the end effector 310 about the knuckle axis KX is constrained by the truncated arm link. It is noted that the split bands 454A, 454B, 455A, 455B, 462A, 462B, 472A, 472B of the respective bands 454, 455, 462, 472 for driving a respective common set of pulleys are located at the same height/elevation (i.e., a single band height) as illustrated in FIG. 4E (see also FIG. 4D). FIG. 4E illustrates band 455 as having band sections (e.g., split bands) 455A, 455B disposed at a common height (i.e., that is the height of a single band) on the pulley 452 (and pulley 453) to provide for the stack height H3. Bands 454, 455, 462, 472 may have a similar arrangement so that the stack height of the transport arm 300 is minimized to provide for a smaller transfer chamber height compared to split bands disposed at different heights on a common pulley.

As illustrated in, e.g., FIG. 3A, the forearm link 305 is tapered in height between the elbow axis EX and the wrist axis WX. For example, the forearm link 305 may have a height of H10 adjacent or at the elbow axis EX and a height H11 adjacent or at the wrist axis WX. This taper of the forearm link 305 along with the configuration of the end effector 310 and truncated arm link 307 provide for the height H3 that allows the transport arm 300 to conform within a pass through (e.g., the port 520P) of the slot valve 521 (see FIG. 5A) as described above. The upper arm link 302 may also have a tapered height between the shoulder axis SX and the elbow axis EX. For example, the upper arm link 302 may have a height H12 adjacent or at the shoulder axis SX and a height H13 adjacent or at the elbow axis EX so that the upper arm link 302 is tapered in height. The taper of the upper arm link 302 (e.g., mating tapered configuration) complements or is reciprocal to the taper (e.g., tapered configuration) of the forearm link 305 so that at least a portion of the upper arm link 302 and a portion of the forearm link 305 are coplanar and so as to provide a compact overall height H20 of the transport arm 300 compared to a transport arm having arm links that are not tapered in height.

FIGS. 5A-5F are exemplary illustrations of a sequence of extending the transport arm 300 between deep substrate holding stations 500 of processing modules 590, 590A disposed on opposite sides of the shoulder axis SX. Here the transport arm 300 is configured to bi-directionally extend (e.g., from full extension on one side of the shoulder axis, through a home pose of the transport arm, to full extension on an opposite side of the shoulder axis—see FIGS. 5A-5F with the home pose illustrated in FIGS. 3B and 5D) along the axis of extension and retraction R (which may be aligned with the shoulder axis SX so as to a radial extension/retraction) on opposite sides of the shoulder axis SX without rotation of the transport arm 300 as a rotating unit about the shoulder axis SX (e.g., in the θ (theta) direction). The bi-directional extension along the axis of extension and retraction R on opposite sides of the shoulder axis is performed in in a substantially continuous linear extension that is independent of rotation of the arm links 302, 305, 307 as a rotating unit about the shoulder axis SX. The knuckle axis KX passes over a center of the shoulder axis SX as the transport arm 300 bi-directionally extends on opposite sides of the shoulder axis SX without rotation of the arm links 302, 305, 307 as a rotating unit about the shoulder axis SX (e.g., so that the transport arm has a compact configuration). For example, referring also to FIG. 4C, to extend the transport arm 300 the drive shaft 91401 may be held stationary (or rotated in an opposite second direction RT2 relative to drive shaft 91402) by the drive section 200 while the drive shaft 91402 is rotated in a first rotation direction RT1 so as to cause rotation of the upper arm link 302 in the first rotation direction RT1. Holding the drive shaft 91401 stationary (or rotating the drive shaft 91401 in the second direction RT2) causes relative rotation between the forearm link 305 and the upper arm link 302. The relative rotation between the forearm link 305 and the upper arm link 302 causes first forearm pulley 450 to drive rotation of the second forearm pulley 451, and hence drive rotation of the truncated arm link 307 as shown in the sequential illustrations in FIGS. 5A-5F. It is noted that in the home pose (see FIG. 3B) the third or truncated link 307 is substantially aligned with (e.g., generally coincides with) the forearm link 305 so that the transport arm 300 has a compact configuration.

Figure 7:
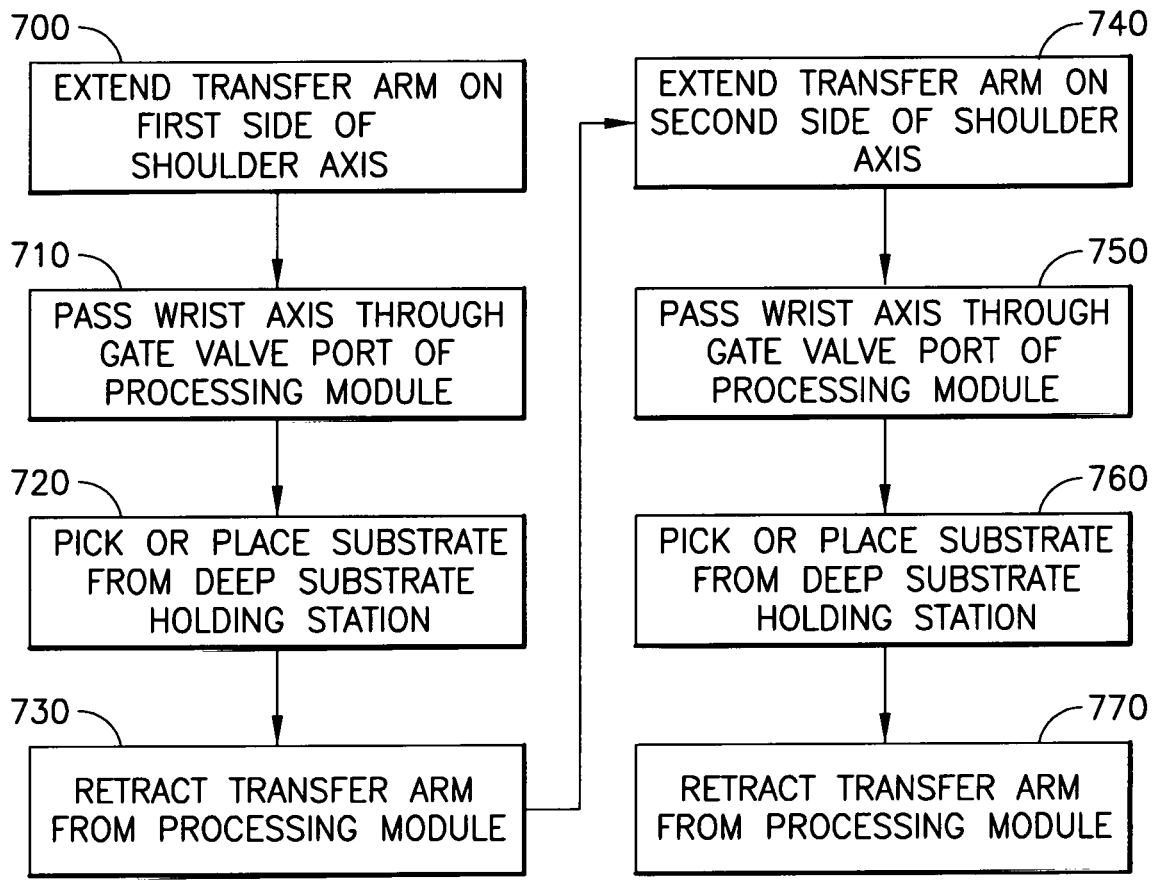
FIG. 7 is a flow diagram of an exemplary operation of a substrate transport apparatus in accordance with aspects of the disclosed embodiment.
Figure 8:
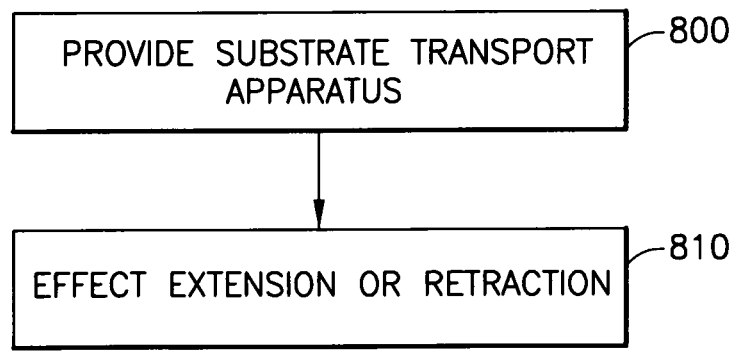
FIG. 8 is a flow diagram of an exemplary method in accordance with aspects of the disclosed embodiment.

Referring to FIGS. 5A-5F, 7 and 8, and exemplary method for transporting substrates will be described. The substrate transport apparatus 104 is provided (FIG. 8, Block 800). The extension or retraction of the upper arm link 302, the forearm link 305, the truncated arm link 307, and the end effector 310 is effected with drive system 200 (or any of drive systems 200A-200C) so that the wrist axis WX extends through the port 521P of a slot valve 521 (FIG. 8, Block 810). For example, as shown in FIGS. 5A-5F, the drive section 200 (or depending on the number of degrees of freedom the transport arm 300 is driven by, drive sections 200A-200C) is operated, as described herein, to extend the transport arm 300 along the axis of extension and retraction R on a first side of the shoulder axis SX (FIG. 7, Block 700)

to pick or place a substrate S from/to the deep set substrate holding station 500. The transport arm 300 is extended by the drive section 200 so that the wrist axis WX passes through the gate valve 251 port 521P of processing module 590 and into the processing module 590 as shown in FIG. 5B (FIG. 7, Block 710). Here the truncated arm link 307 is rotated about the knuckle axis KX to provide the transport arm 300 with an extended reach within the processing module 590 for accessing at least the deep set substrate holding station 500. The substrate is picked or placed from/to the deep set substrate holding station 500 (FIG. 7, Block 720) of processing module 590 in any suitable manner, such as by relative Z axis movement between the end effector 310 and the deep set substrate holding station 500. The drive section 200 is operated, as described herein, to retract the transport arm 300 from the processing module 590 as shown in FIGS. 5B and 5C (FIG. 7, Block 730) along the axis of extension and retraction R. Without rotation of the transport arm 300 as a unit about the shoulder axis SX, the drive section 200 may be operated to extend the transport arm 300 along the axis of extension and retraction R on a second opposite side of the shoulder axis SX as shown in FIGS. 5D and 5E (FIG. 7, Block 740) to pick or place a substrate to deep set substrate holding station 500 of processing module 590A. Here the processing module 590A is disposed on an opposite side of the transport chamber 580 than processing module 590 so that common axis of extension and retraction R extends through the deep set substrate holding stations 500 of both processing modules 590, 590A along a substantially straight line path. The transport arm 300 is extended by the drive section 200 so that the wrist axis WX passes through the gate valve 251 port 521P of processing module 590A and into the processing module 590A as shown in FIG. 5B (FIG. 7, Block 750). Here again, the truncated arm link 307 is rotated about the knuckle axis KX to provide the transport arm 300 with an extended reach within the processing module 590A for accessing at least the deep set substrate holding station 500. The substrate is picked or placed from/to the deep set substrate holding station 500 (FIG. 7, Block 760) of processing module 590A in any suitable manner, such as by relative Z axis movement between the end effector 310 and the deep set substrate holding station 500. The drive section 200 is operated, as described herein, to retract the transport arm 300 from the processing module 590A in a manner similar to that shown in FIGS. 5B and 5C (FIG. 7, Block 770) along the axis of extension and retraction R. The transport arm 300 may be rotated as a unit about the shoulder axis SX so that the transport arm 300 extends along any other suitable axis of extension and retraction, such as axis of extension and retraction R1 (see FIG. 5F), angled relative to axis of extension and retraction R for transporting substrates to/from any desired location accessible from the transport chamber 580.

As noted above, the first wrist pulley 470 is rotationally fixed to the forearm link 305 and the relative rotation between the truncated arm link 307 and the forearm link 305 causes the first wrist pulley 470 to drive rotation of the second wrist pulley 471 and hence drive rotation of the end effector 310. The relative rotations between the upper arm link 302, the forearm link 305 and the truncated arm link 307 are such that the end effector 310 is positioned in rotation about the knuckle axis KS and along the axis of extension and retraction so that the substrate S held by the end effector 310 is placed at the deep set substrate station 500 in a desired predetermined rotational orientation (e.g., without a need for further rotation of the substrate S at the deep set substrate station 500 to process the substrate). To rotate the transport arm about the theta axis θ, the drive shafts 91401, 91402 are rotated in the same direction at substantially the same speed to change a direction of the extension/retraction of the end effector 310.

While the above example is provided for a two degree of freedom drive system, it should be understood that the a third degree of freedom (or more) may be added to the drive section for actively driving the first wrist pulley 470 so that the end effector 310 is independently driven about the knuckle axis KX by the third degree of freedom as illustrated in FIGS. 6A-6E. Here another transmission 670 (transmission 480 is omitted from FIG. 6B for clarity), which may be substantially similar to the transmissions 475 and 480 (however the pulleys are not rotationally fixed to the upper arm link 302 or forearm link 305), is provided through the upper arm link 302 and the forearm link 305 for coupling the first wrist pulley 470 to, for example, a third drive shaft (such as drive shaft 280A as illustrated in FIG. 2C where drive shaft 280BS is akin to drive shaft 91401 and drive shaft 280S is akin to drive shaft 91402). Here the transmissions for driving the truncated arm link 307 and the end effector 310 may include low profile pulleys and bands as described in U.S. pre-grant publication number 2018/0019155, published on Jan. 18, 2018 (application Ser. No. 15/634,87), the disclosure of which is incorporated herein by reference in its entirety. In other aspects, each of the upper arm link 302, forearm link 305, truncated link 307, and end effector 310 are independently driven in rotation by a respective degree of freedom of the drive section (such as drive section 200C) as described above.

In one aspect, the transport arm 300 may be substantially similar to that described above, however the end effector may be mounted above or below the truncated arm link 307 so that rotation of the end effector 310 is no longer constrained by the truncated arm link 307.

In accordance with one or more aspects of the disclosed embodiment a substrate processing apparatus comprises: a frame; a transport apparatus connected to the frame, the transport apparatus having an upper arm link, a forearm link rotatably coupled to the upper arm link about an elbow axis, at least a third arm link rotatably coupled to the forearm about a wrist axis, and an end effector rotatably coupled to the third arm link about a knuckle axis; and at least a two degree of freedom drive system operably connected to at least one of the upper arm link, the forearm link, and the third arm link for effecting extension and retraction of the end effector wherein a height of the end effector is within the stack height profile of the wrist axis so that a total stack height of the end effector and wrist axis is sized to conform within a pass through of a slot valve.

In accordance with one or more aspects of the disclosed embodiment a length of the third arm link is less than a length of the upper arm link, and the length of the upper arm link is less than a length of the forearm link.

In accordance with one or more aspects of the disclosed embodiment rotation of the end effector is slaved to rotation of the forearm link and rotation of the third arm link is slaved to rotation of the upper arm link.

In accordance with one or more aspects of the disclosed embodiment the upper arm is rotatably coupled to the two degree of freedom drive system at a shoulder axis; the end effector is a double-ended end effector; and the transport apparatus is configured to bi-directionally extend on opposite sides of the shoulder axis without rotation of the transport apparatus as a unit about the shoulder axis.

In accordance with one or more aspects of the disclosed embodiment the third arm link comprises a slot configured to receive at least a portion of the end effector so that the end effector is rotatably coupled to the third arm link within the slot.

In accordance with one or more aspects of the disclosed embodiment the end effector is disposed above or below the third arm link.

In accordance with one or more aspects of the disclosed embodiment the forearm link is a tapered configuration; and the upper arm link has a mating tapered configuration that is configured to compliment the tapered configuration of the forearm link so that at least a portion of the upper arm link and a portion of the forearm link are coplanar.

In accordance with one or more aspects of the disclosed embodiment the third arm link is slaved to the upper arm link through dual sets of forearm pulleys disposed within the forearm.

In accordance with one or more aspects of the disclosed embodiment an axis of extension and retraction of the transport apparatus passes over a center of a shoulder axis of rotation of the transport apparatus.

In accordance with one or more aspects of the disclosed embodiment the transport apparatus is configured to bi-directionally extend on opposite sides of a shoulder axis of the transport apparatus, where radial extension of the transport arm is substantially symmetric on the opposite sides of the shoulder axis.

In accordance with one or more aspects of the disclosed embodiment the end effector remains aligned with an axis of extension and retraction throughout a range of extension and retraction of the transport apparatus.

In accordance with one or more aspects of the disclosed embodiment the third arm link is substantially aligned with the forearm link with the transport apparatus in a home pose.

In accordance with one or more aspects of the disclosed embodiment the third arm link is driven by a band transmission having a single band height.

In accordance with one or more aspects of the disclosed embodiment a substrate processing apparatus comprises: a frame; a transport apparatus connected to the frame, the transport apparatus having an upper arm link, a forearm link rotatably coupled to the upper arm link about an elbow axis, at least a third arm link rotatably coupled to the forearm about a wrist axis, and an end effector rotatably coupled to the third arm link about a knuckle axis; and a drive system operably connected to at least one of the upper arm link, the forearm link, and the third arm link for effecting extension and retraction of the end effector wherein the transport apparatus has a reach that is a maximum reach of the transport apparatus for a predetermined swing diameter of the transport apparatus with the upper arm link, forearm link, third arm link, and end effector in a retracted configuration, which maximum reach extends the end effector, its knuckle axis, and at least part of the third arm link including the wrist axis through a slot valve of the substrate processing apparatus.

In accordance with one or more aspects of the disclosed embodiment the drive system is a two degree of freedom drive system.

In accordance with one or more aspects of the disclosed embodiment rotation of the end effector is slaved to rotation of the forearm link and rotation of the third arm link is slaved to rotation of the upper arm link.

In accordance with one or more aspects of the disclosed embodiment the drive system is a three degree of freedom drive system.

In accordance with one or more aspects of the disclosed embodiment the drive system is a four degree of freedom drive system.

In accordance with one or more aspects of the disclosed embodiment a length of the third arm link is less than a length of the upper arm link, and the length of the upper arm link is less than a length of the forearm link.

In accordance with one or more aspects of the disclosed embodiment the upper arm is rotatably coupled to the two degree of freedom drive system at a shoulder axis; the end effector is a double-ended end effector; and the transport apparatus is configured to bi-directionally extend on opposite sides of the shoulder axis without rotation of the transport apparatus as a unit about the shoulder axis.

In accordance with one or more aspects of the disclosed embodiment the third arm link comprises a slot configured to receive at least a portion of the end effector so that the end effector is rotatably coupled to the third arm link within the slot.

In accordance with one or more aspects of the disclosed embodiment the end effector is disposed above or below the third arm link.

In accordance with one or more aspects of the disclosed embodiment the forearm link is a tapered configuration; and the upper arm link has a mating tapered configuration that is configured to compliment the tapered configuration of the forearm link so that at least a portion of the upper arm link and a portion of the forearm link are coplanar.

In accordance with one or more aspects of the disclosed embodiment an axis of extension and retraction of the transport apparatus passes over a center of a shoulder axis of rotation of the transport apparatus.

In accordance with one or more aspects of the disclosed embodiment the transport apparatus is configured to bi-directionally extend on opposite sides of a shoulder axis of the transport apparatus, where radial extension of the transport arm is substantially symmetric on the opposite sides of the shoulder axis.

In accordance with one or more aspects of the disclosed embodiment the end effector remains aligned with an axis of extension and retraction throughout a range of extension and retraction of the transport apparatus.

In accordance with one or more aspects of the disclosed embodiment the third arm link is substantially aligned with the forearm link with the transport apparatus in a home pose.

In accordance with one or more aspects of the disclosed embodiment the third arm link is driven by a band transmission having a single band height.

In accordance with one or more aspects of the disclosed embodiment a method for transporting substrates comprises: providing a transport apparatus connected to the frame, the transport apparatus having an upper arm link, a forearm link rotatably coupled to the upper arm link about an elbow axis, at least a third arm link rotatably coupled to the forearm about a wrist axis, and an end effector rotatably coupled to the third arm link about a knuckle axis; and effecting extension or retraction of the upper arm link, the forearm link, the third arm link, and the end effector with a two degree of freedom drive system so that the wrist axis extends through a pass through of a slot valve; wherein a height of the end effector is within the stack height profile of the wrist axis so that a total stack height of the end effector and wrist axis is sized to conform within the pass through of the slot valve.

In accordance with one or more aspects of the disclosed embodiment the transport apparatus has a reach that is a maximum reach of the transport apparatus for a predetermined swing diameter of the transport apparatus with the upper arm link, forearm link, third arm link, and end effector in a retracted configuration, which maximum reach extends the end effector, its knuckle axis, and at least part of the third arm link including the wrist axis through the slot valve of the substrate processing apparatus.

In accordance with one or more aspects of the disclosed embodiment the method further comprises bi-directionally extending the upper arm link, the forearm link, the third arm link, and the end effector on opposite sides of the shoulder axis without rotation of the transport apparatus as a unit about the shoulder axis.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprises:
   a frame;
   a transport apparatus connected to the frame, the transport apparatus having an upper arm link, a forearm link rotatably coupled to the upper arm link about an elbow axis, at least a third arm link rotatably coupled to the forearm link about a wrist axis, and an end effector rotatably coupled to the third arm link about a knuckle axis; and
   at least a two degree of freedom drive system operably connected to at least one of the upper arm link, the forearm link, and the third arm link effecting, with two degrees of freedom of the drive system, extension and retraction of the end effector in a horizontal plane wherein a height of the end effector is within a total stack height profile defined by a stack height of the forearm link and the at least the third arm link at and adjacent the wrist axis so that the total stack height at and adjacent the wrist axis is at least in part coincident with the end effector, and the total stack height is sized to conform within a pass through of a slot valve.

2. The substrate processing apparatus of claim 1, wherein a length of the third arm link is less than a length of the upper arm link, and the length of the upper arm link is less than a length of the forearm link.

3. The substrate processing apparatus of claim 1, wherein rotation of the end effector is slaved to rotation of the forearm link and rotation of the third arm link is slaved to rotation of the upper arm link.

4. The substrate processing apparatus of claim 1, wherein:
   the upper arm link is rotatably coupled to the two degree of freedom drive system at a shoulder axis;
   the end effector is a double-ended end effector; and
   the transport apparatus is configured to bi-directionally extend on opposite sides of the shoulder axis without rotation of the transport apparatus as a unit about the shoulder axis.

5. The substrate processing apparatus of claim 1, wherein the third arm link comprises a slot configured to receive at least a portion of the end effector so that the end effector is rotatably coupled to the third arm link within the slot.

6. The substrate processing apparatus of claim 1, wherein the end effector is disposed above or below the third arm link.

7. The substrate processing apparatus of claim 1, wherein:
   the forearm link is a tapered configuration; and
   the upper arm link has a mating tapered configuration that is configured to compliment the tapered configuration of the forearm link so that at least a portion of the upper arm link and a portion of the forearm link are coplanar.

8. The substrate processing apparatus of claim 1, wherein the third arm link is slaved to the upper arm link through dual sets of forearm pulleys disposed within the forearm link.

9. The substrate processing apparatus of claim 1, wherein an axis of extension and retraction of the transport apparatus passes over a center of a shoulder axis of rotation of the transport apparatus.

10. The substrate processing apparatus of claim 1, wherein the transport apparatus is configured to bi-directionally extend on opposite sides of a shoulder axis of the transport apparatus, where radial extension of the transport arm is substantially symmetric on the opposite sides of the shoulder axis.

11. The substrate processing apparatus of claim 1, wherein the end effector remains aligned with an axis of extension and retraction throughout a range of extension and retraction of the transport apparatus.

12. The substrate processing apparatus of claim 1, wherein the third arm link is substantially aligned with the forearm link with the transport apparatus in a home pose.

13. The substrate processing apparatus of claim 1, wherein the third arm link is driven by a band transmission having a single band height.

14. A substrate processing apparatus comprising:
    a frame;
    a transport apparatus connected to the frame, the transport apparatus having an upper arm link, a forearm link rotatably coupled to the upper arm link about an elbow axis, at least a third arm link rotatably coupled to the forearm link about a wrist axis, and an end effector rotatably coupled to the third arm link about a knuckle axis; and
    a drive system operably connected to at least one of the upper arm link, the forearm link, and the third arm link for effecting extension and retraction of the end effector wherein the transport apparatus has a reach that is a maximum reach of the transport apparatus for a predetermined swing diameter of the transport apparatus with the upper arm link, forearm link, third arm link, and end effector in a retracted configuration, which maximum reach extends the end effector, its knuckle axis, and at least part of the third arm link including the wrist axis through a slot valve of the substrate processing apparatus.

15. The substrate processing apparatus of claim 14, wherein the drive system is a two degree of freedom drive system.

16. The substrate processing apparatus of claim 15, wherein rotation of the end effector is slaved to rotation of the forearm link and rotation of the third arm link is slaved to rotation of the upper arm link.

17. The substrate processing apparatus of claim 14, wherein the drive system is a three degree of freedom drive system.

18. The substrate processing apparatus of claim 14, wherein the drive system is a four degree of freedom drive system.

19. The substrate processing apparatus of claim 14, wherein a length of the third arm link is less than a length of the upper arm link, and the length of the upper arm link is less than a length of the forearm link.

20. The substrate processing apparatus of claim 14, wherein:
the upper arm link is rotatably coupled to the drive system at a shoulder axis;
the end effector is a double-ended end effector; and
the transport apparatus is configured to bi-directionally extend on opposite sides of the shoulder axis without rotation of the transport apparatus as a unit about the shoulder axis.

21. The substrate processing apparatus of claim 14, wherein the third arm link comprises a slot configured to receive at least a portion of the end effector so that the end effector is rotatably coupled to the third arm link within the slot.

22. The substrate processing apparatus of claim 14, wherein the end effector is disposed above or below the third arm link.

23. The substrate processing apparatus of claim 14, wherein:
the forearm link is a tapered configuration; and
the upper arm link has a mating tapered configuration that is configured to compliment the tapered configuration of the forearm link so that at least a portion of the upper arm link and a portion of the forearm link are coplanar.

24. A method for transporting substrates comprising:
providing a transport apparatus connected to a frame, the transport apparatus having an upper arm link, a forearm link rotatably coupled to the upper arm link about an elbow axis, at least a third arm link rotatably coupled to the forearm link about a wrist axis, and an end effector rotatably coupled to the third arm link about a knuckle axis; and
effecting, with two degrees of freedom of a two degree of freedom drive system, extension or retraction of the upper arm link, the forearm link, the third arm link, and the end effector in a horizontal plane, on opposite sides of a shoulder axis of the transport apparatus and crossing over the shoulder axis so that the wrist axis extends through a pass through of a slot valve of a substrate processing apparatus on each of the opposite sides to one or more of pick and place substrates;
wherein a height of the end effector is within a stack height profile of the wrist axis so that a total stack height of the end effector and wrist axis is sized to conform within the pass through of the slot valve.

25. The method of claim 24, wherein the transport apparatus has a reach that is a maximum reach of the transport apparatus for a predetermined swing diameter of the transport apparatus with the upper arm link, forearm link, third arm link, and end effector in a retracted configuration, which maximum reach extends the end effector, its knuckle axis, and at least part of the third arm link including the wrist axis through the slot valve of the substrate processing apparatus.

26. The method of claim 24, further comprising bi-directionally extending the upper arm link, the forearm link, the third arm link, and the end effector on opposite sides of the shoulder axis of the transport apparatus without rotation of the transport apparatus as a unit about the shoulder axis.

27. The method of claim 24, wherein the third arm link is slaved to the upper arm link through dual sets of forearm pulleys disposed within the forearm link.

* * * * *